United States Patent
Votava et al.

(10) Patent No.: US 10,953,560 B2
(45) Date of Patent: Mar. 23, 2021

(54) CONVERSION AND APPLICATION OF MATERIAL STRIPS

(71) Applicant: 3M INNOVATIVE PROPERTIES COMPANY, St. Paul, MN (US)

(72) Inventors: Mark J. Votava, Stillwater, MN (US); Paul J. Cobian, Woodbury, MN (US); Jiaying Ma, Cottage Grove, MN (US); Waldo L. Lopez, Harris, MN (US); Dagny M. Joffre, Lowell, MA (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 129 days.

(21) Appl. No.: 16/311,277

(22) PCT Filed: Jun. 21, 2017

(86) PCT No.: PCT/US2017/038496
§ 371 (c)(1),
(2) Date: Dec. 19, 2018

(87) PCT Pub. No.: WO2017/223175
PCT Pub. Date: Dec. 28, 2017

(65) Prior Publication Data
US 2019/0232512 A1 Aug. 1, 2019

Related U.S. Application Data

(60) Provisional application No. 62/352,723, filed on Jun. 21, 2016.

(51) Int. Cl.
*B26D 1/24* (2006.01)
*B26D 7/02* (2006.01)
(Continued)

(52) U.S. Cl.
CPC ............ *B26D 1/245* (2013.01); *B26D 7/018* (2013.01); *B26D 7/02* (2013.01); *B26D 7/18* (2013.01);
(Continued)

(58) Field of Classification Search
CPC .......... B26D 1/245; B26D 7/018; B26D 7/02; B26D 7/18; B26D 7/32; B26D 1/225;
(Continued)

(56) References Cited

U.S. PATENT DOCUMENTS 4,235,643 A 11/1980 Amick
4,246,042 A 1/1981 Knasel
(Continued)

FOREIGN PATENT DOCUMENTS

CA 2257498 A1 7/1999
CN 202186790 4/2011
(Continued)

OTHER PUBLICATIONS

Search Report for CN Appl. No. 201780038891.1, dated Mar. 20, 2020, 2 pp.
(Continued)

*Primary Examiner* — Christopher T Schatz
*Assistant Examiner* — Cynthia L Schaller
(74) *Attorney, Agent, or Firm* — Gregg H. Rosenblatt

(57) ABSTRACT

A system for converting and attaching material strips to a substrate includes a dispenser configured to advance an elongated tape having length l1 and width w1 with l1>w1 relative to a surface of a substrate. A cutting tool cuts the elongated tape transversely along the width w1 of the tape to produce a strip having length l2 and width w2. During the cutting, a portion of the cutting Stool pushes a first surface of the strip against a gripper while cutting the tape. The gripper holds the first surface of the strip against the gripper
(Continued)

while moving to position an opposing, second surface of the strip over the surface of the substrate. The gripper releases the strip after positioning the strip.

14 Claims, 16 Drawing Sheets

(51) Int. Cl.
| | | |
|---|---|---|
| B26D 7/18 | (2006.01) | |
| B26D 7/32 | (2006.01) | |
| H01L 31/18 | (2006.01) | |
| H01L 31/20 | (2006.01) | |
| B26D 7/01 | (2006.01) | |

(52) U.S. Cl.
CPC ............... *B26D 7/32* (2013.01); *H01L 31/18* (2013.01); *H01L 31/206* (2013.01); *Y02E 10/50* (2013.01); *Y02P 70/50* (2015.11)

(58) Field of Classification Search
CPC ....... B26D 3/085; H01L 31/18; H01L 31/206; H01L 21/67092; H01L 21/67132; Y02E 10/50; Y02P 70/521; B65H 35/04
See application file for complete search history.

(56) References Cited

U.S. PATENT DOCUMENTS

| | | | |
|---|---|---|---|
| 4,576,850 A | 3/1986 | Martens | |
| 5,294,282 A | 3/1994 | Rock | |
| 5,320,684 A | 6/1994 | Amick | |
| 5,431,767 A | 7/1995 | Koza | |
| 5,994,641 A | 11/1999 | Kardauskas | |
| 6,165,306 A * | 12/2000 | Rajala | B65H 39/14 156/263 |
| 2003/0192639 A1 | 10/2003 | Mitchell | |
| 2006/0081321 A1 | 4/2006 | Bradshaw | |
| 2006/0107991 A1 | 5/2006 | Baba | |
| 2006/0177954 A1 | 8/2006 | Jeong | |
| 2007/0157778 A1 | 7/2007 | Lohrengel | |
| 2009/0188628 A1* | 7/2009 | Kasahara | B65H 35/0033 156/361 |
| 2010/0200046 A1 | 8/2010 | Sauar | |
| 2010/0243146 A1 | 9/2010 | Whitworth | |
| 2010/0243148 A1 | 9/2010 | Kaufmann | |
| 2010/0330726 A1 | 12/2010 | Gonsiorawski | |
| 2011/0151350 A1* | 6/2011 | Iverson | H01M 8/1004 429/480 |
| 2012/0208411 A1 | 8/2012 | Krokoszinski | |
| 2012/0247554 A1 | 10/2012 | Wootton | |
| 2013/0052773 A1 | 2/2013 | Brod | |
| 2013/0065353 A1 | 3/2013 | Albrecht | |
| 2013/0294875 A1 | 11/2013 | Prahlad | |
| 2014/0190545 A1 | 7/2014 | Lei | |

FOREIGN PATENT DOCUMENTS

| | | |
|---|---|---|
| CN | 102054902 | 5/2011 |
| CN | 201868461 | 6/2011 |
| CN | 102267582 A | 12/2011 |
| CN | 102487107 | 6/2012 |
| CN | 102522452 | 6/2012 |
| CN | 102544202 | 7/2012 |
| CN | 102642649 A | 8/2012 |
| CN | 102694079 | 9/2012 |
| CN | 202758922 | 2/2013 |
| CN | 103633186 | 3/2014 |
| CN | 203826412 | 9/2014 |
| CN | 205060205 U | 3/2016 |
| DE | 102011076900 | 12/2012 |
| JP | 2008300403 | 12/2008 |
| JP | 2012099576 | 5/2012 |
| JP | 2012182490 | 9/2012 |
| JP | 2012248639 | 12/2012 |
| JP | 2013012540 | 1/2013 |
| JP | 2013012679 | 1/2013 |
| JP | 2013038210 | 2/2013 |
| JP | 2013138141 | 7/2013 |
| JP | 2013165138 | 8/2013 |
| JP | 2013187312 | 9/2013 |
| KR | 101367297 | 3/2014 |
| TW | 2010021937 | 6/2010 |
| TW | 201413988 | 4/2014 |
| WO | WO 2014-112424 | 7/2014 |
| WO | WO 2015-155411 | 10/2015 |

OTHER PUBLICATIONS

International Search report for PCT International Application No. PCT/US2017/038496 dated Aug. 28, 2017, 2 pages.

* cited by examiner

CONVERSION AND APPLICATION OF MATERIAL STRIPS

TECHNICAL FIELD

This disclosure relates generally to systems and methods for manufacturing products that include material strips.

BACKGROUND

One of the promising energy resources today is sunlight. Globally, millions of households currently obtain power from solar photovoltaic systems. The rising demand for solar power has been accompanied by a rising demand for devices and materials capable of fulfilling the requirements for these applications. Converting sunlight to electrical power may be accomplished by the use of photovoltaic cells (PV cells). Photovoltaic cells are relatively small in size and typically are combined into a physically integrated PV cell module having a greater power output. Photovoltaic cell modules are generally formed from two or more "strings" of PV cells, comprising a plurality of PV cells arranged in a row and electrically connected in series using tinned flat copper wires which may also be referred to as electrical connections, tabbing ribbons, bus bars or bus wires.

Photovoltaic cell modules typically comprise one or more PV cells surrounded by an encapsulant, on both sides of the PV cell. Two panels of glass (or a suitable polymeric material) are positioned adjacent and bonded to the front-side and backside of the encapsulant. At least the front side panel is transparent to solar radiation and is typically referred to as front-side layer. The backside panel may be transparent to solar radiation and is referred to as the backside layer, or backsheet. The front-side layer and the backsheet may be made of the same material or different materials. The encapsulant is a light transparent polymer material that encapsulates the PV cells and also is bonded to the front-side layer and backsheet so as to physically seal off the cells. This laminated construction provides mechanical support for the cells and also protects them against damage due to environmental factors such as wind, snow, and ice.

The PV cell module may be fit into a metal frame, with a sealant covering the edges of the module engaged by the metal frame. The metal frame protects the edges of the module, provides additional mechanical strength, and facilitates combining it with other modules so as to form a larger array or solar panel that can be mounted to a suitable support that holds the modules at the proper angle to maximize reception of solar radiation.

BRIEF SUMMARY

According to some embodiments, a system for converting and applying material strips to a substrate includes a dispenser configured to advance an elongated tape having length l1 and width w1 with l1>w1 relative to a substrate. A cutting tool cuts the elongated tape transversely along the width w1 of the tape to produce a strip having length l2 and width w2. The strip has a first surface and an opposing second surface and a portion of the cutting tool is configured to push the first surface of the strip against a gripper while cutting the tape. The gripper holds the first surface of the strip against the gripper while moving to position the second surface of the strip over the surface of the substrate, such as a solar substrate. The gripper is configured to release the strip after positioning the strip. In some embodiments, the length of the strip is equal to the width of the tape, l2=w1. In some embodiments, the length of the strip may be greater or less than the width of the tape.

Some embodiments involve a method for attachment of material strips onto a substrate, e.g., a solar substrate. The method involves advancing an elongated tape having length l1 and width w1 with l1>w1 relative to the substrate. The elongated tape is cut with a cutting tool transversely along the width w1 of the tape to produce a strip having length l2 and width w2. As the cutting tool cuts the tape a portion of the cutting tool simultaneously pushes the strip against a gripper. The strip is held by the gripper while the strip is positioned on a surface of the substrate. After positioning, the strip is released from the gripper. In some embodiments, the length of the strip is equal to the width of the tape, l2=w1. In various embodiments, the length of the strip may be equal to, greater than or less than the width of the tape.

These and other aspects of the present application will be apparent from the detailed description below. In no event, however, should the above summaries be construed as limitations on the claimed subject matter, which subject matter is defined solely by the attached claims.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DESCRIPTION OF ILLUSTRATIVE EMBODIMENTS

Embodiments disclosed herein involve systems and methods for manufacturing products that include strips or layers of material that are positioned on a substrate. The concepts are described in terms of positioning strips onto solar substrates such as individual PV cells, or substrates that are components of PV cell modules, e.g., backsheets, encapsulant, glass, metal, tapes, thin film depositions, etc. However, it will be appreciated that the concepts are equally applicable to other types of substrates, such as semiconductor substrates, printed circuit boards, glass substrates, metal substrates, textile substrates and/or polymeric film substrates.

The disclosed systems and methods are useful to cut and place strips of material on the surfaces of a solar substrate, e.g., onto surfaces of PV cells and/or between PV cells in a PV cell module. The solar substrate may include, for example, a PV cell, an encapsulant, a backsheet, a glass cover, etc., and the strips can be placed on a surface of any one or more of these solar substrate components. The strips can include but are not limited to: current collection bus bars that extend across the front and/or back side surfaces of the PV cells, tabbing ribbons that extend across the front and/or back side surfaces of PV cells and/or between PV cells to interconnect the PV cells in a module. The strips may include light redirecting films (LRF) that extend over the bus bars, tabbing ribbons and/or other inactive regions of the PV cell module to enhance light absorption of the PV cells.

Figure 1A:
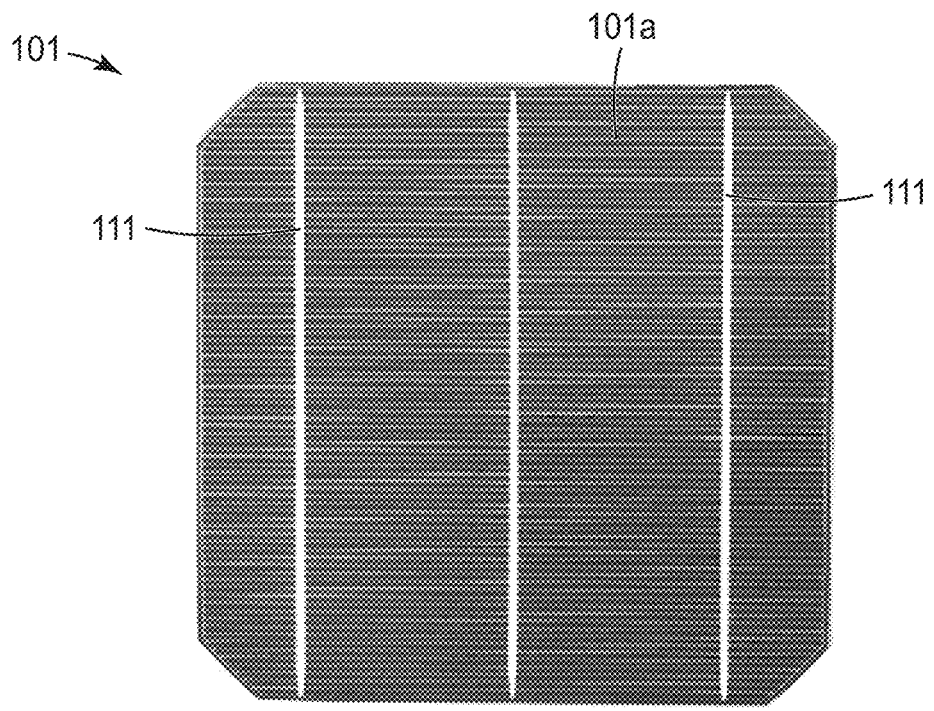
FIGS. 1A and 1B respectively show photographs of the front and back sides of a PV cell.
Figure 1B:
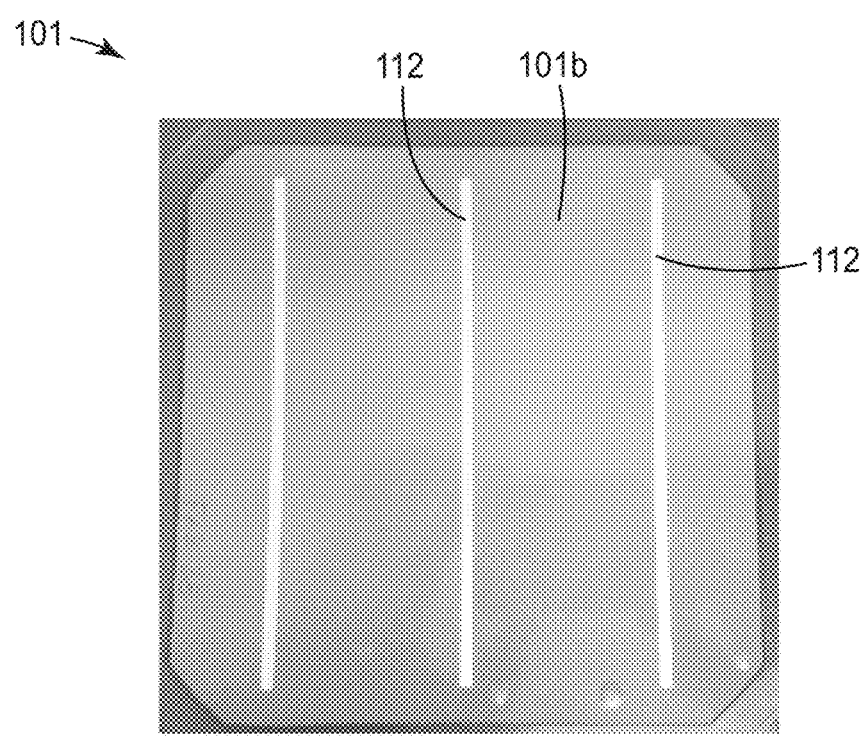
Figure 1C:
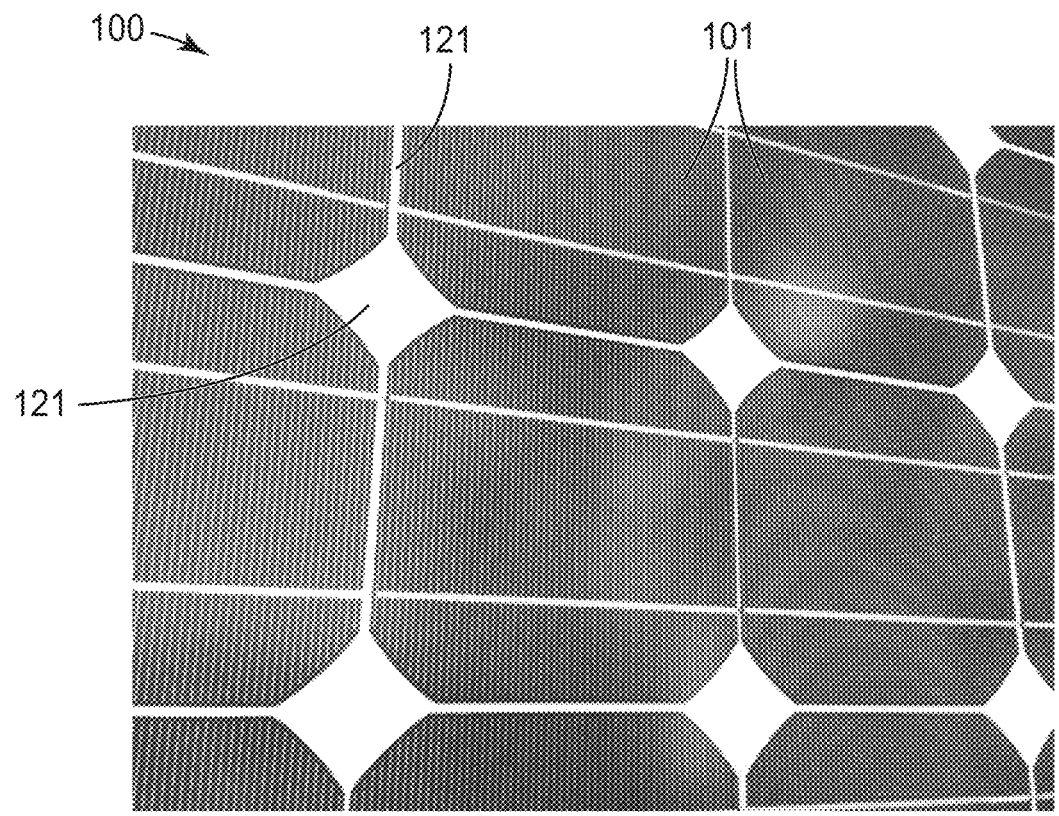
FIG. 1C is a photograph that shows a portion of a PV cell module comprising multiple PV cells.
Figure 2A:
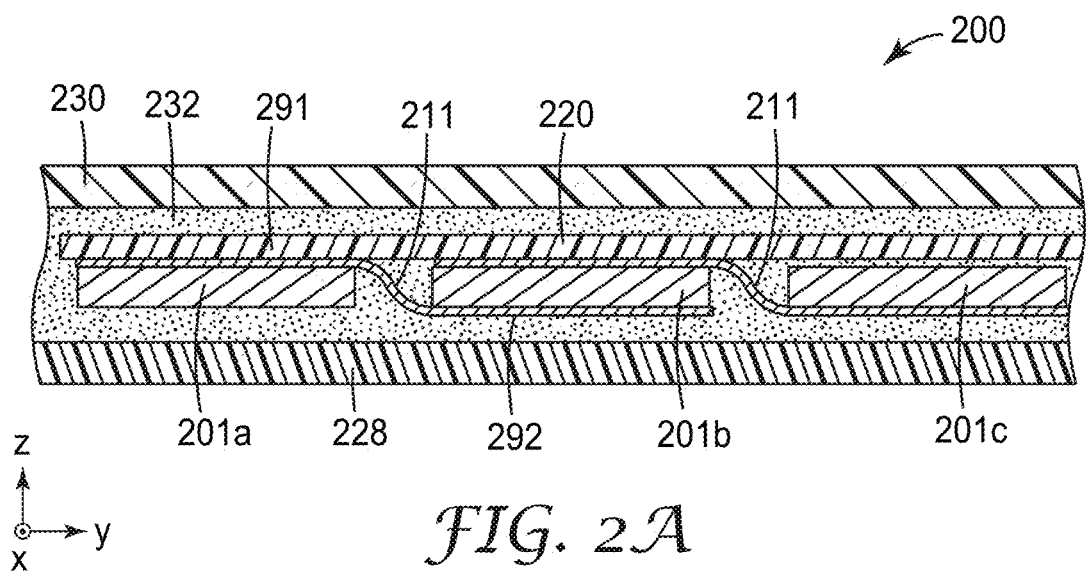
FIG. 2A is a cross sectional drawing of a interconnected PV cells of a portion of a PV cell module in accordance with some embodiments.

FIGS. 1A and 1B respectively show photographs of the front 101a and back 101b sides of a PV cell 101; FIG. 1C is a photograph that shows a portion of a PV cell module 100 comprising multiple PV cells 101; and FIG. 2A is a cross sectional drawing of a interconnected PV cells 201a-c of a portion of a PV cell module 200 in accordance with some embodiments.

As illustrated in FIGS. 1A and 1B, PV cells 101 may include current collection bus bars 111 on the front, light absorption, side 101a of the PV cells 101 and may also include bus bars 112 on the back side 101b of the cells 101. In some configurations, the front and/or back side bus bars may be screen printed or otherwise deposited on the PV cell surfaces 101a, 101b. In some configurations, the front and/or back side bus bars may comprise strips of metal, such as copper or aluminum strips that are less than 3 mm, less than 2 mm, less than 1.5 mm, or even less than 1 mm in width. The front and/or back side bus bars may be attached by adhesive or solder to the PV cells. As best seen in the cross sectional diagram of FIG. 2A, PV cells 201a-c in a module 200 connected in series may include electrically conductive tabbing ribbons 211 that extend from the front side 291 of one cell 201a to the back side 292 of an adjacent cell 201b.

With reference to FIGS. 1A through 1C, on the front sides 101a of the PV cells 101, the bus bars 111 and/or tabbing ribbons result in inactive shaded areas that reduce the active surface area available for absorption of incident light. Therefore, the amount of current that is produced by the PV cell 101 is correspondingly reduced by the presence of front side bus bars 111 and/or tabbing ribbons. Similarly, blank areas 121 between PV cells 101 arranged in a PV cell module 100 do not contribute to light absorption or current production of the module 100.

Figure 2B:
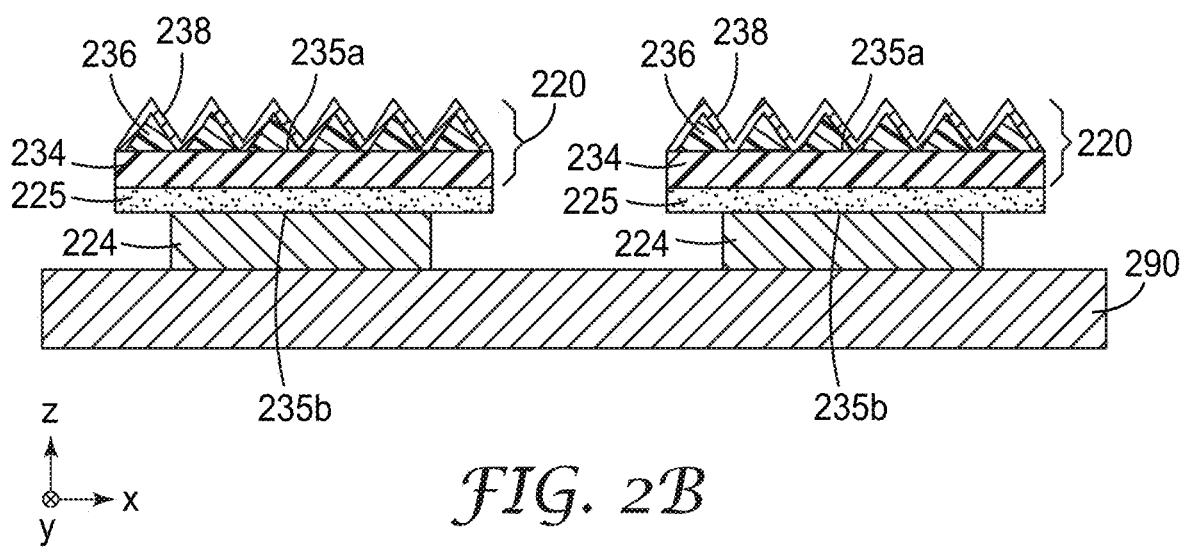
FIG. 2B is a cross sectional view of a portion of a PV substrate comprising a photovoltaic (PV) cell having bus bars with light redirecting film (LRF) disposed on the bus bars in accordance with some embodiments.

According to some embodiments, a light redirecting film (LRF) may be placed on the bus bars, tabbing ribbons of PV cells and/or blank areas of modules, and/or other inactive shaded regions of the PV cells or PV cell modules. The LRF redirects the light toward the active region of the PV cell or PV cell module. In this way, the total power of the PV cell or PV cell module can be increased. FIG. 2A shows a PV cell module 200 with LRF 220 disposed over the tabbing ribbons 211 on the front side 201a of the PV cells in a PV cell module. FIG. 2B is a cross sectional view of a portion of a solar substrate 290 comprising a PV cell 291 having bus bars 224 with LRF 220 disposed on the bus bars 224.

As shown in FIG. 2A, the PV cell module 200 may include a back protector member, often in the form of backsheet 228. In some embodiments, backsheet 228 is an electrically insulating material such as glass, a polymeric layer, a polymeric layer reinforced with reinforcing fibers (e.g., glass, ceramic or polymeric fivers), or a wood particle board. In some embodiments, backsheet 228 includes a type of glass or quartz. In some embodiments, the glass is thermally tempered. Some exemplary glass materials include soda-lime-silica based glass. In other embodiments, backsheet 228 is a polymeric film. Exemplary backsheets include multilayer polymer films. One commercially available example of a backsheet is the 3M™ Scotchshield™ film commercially available from 3M Company, Saint Paul, Minn. Exemplary backsheets are those that include extruded PTFE. The backsheet may be connected to a building material, such as a roofing membrane (for example, in building integrated photovoltaics (BIPV))

Overlying PV cells 201a-c, is a generally planar light transmitting and electrically non-conducting front-side layer 230, which also provides support to the PV cells 201. In some embodiments, front side layer 230 includes a type of glass or quartz. In some embodiments, the glass is thermally tempered. Some exemplary glass materials include soda-lime-silica based glass. In some embodiments, the front-side layer has a low iron content (e.g., less than about 0.10% total iron, more preferably less than about 0.08, 0.07 or 0.06% total iron) and/or an antireflection coating thereon to optimize light transmission. In other embodiments, the front-side layer is a barrier layer.

In some embodiments, an encapsulant 232 is interposed between backsheet 228 and the front-side layer 230, surrounding cells 201a-c, and tabbing ribbons 211. For example, the encapsulant 232 may comprise a suitable light-transparent, electrically non-conducting material. In one embodiment, encapsulant 232 is an ethylene vinyl acetate copolymer (EVA), or an ionomer. In one exemplary method, the encapsulant 232 is provided in the form of discrete sheets that are positioned below and/or on top of the array of PV cells 201, with those components in turn being sandwiched between the backsheet 228 and the front side layer 230. Subsequently the laminate construction is heated under vacuum, causing the encapsulant sheets to become liquified enough to flow around and encapsulate the PV cells 201 while simultaneously filling any voids in the space between the front side layer 230 and backsheet 228. Upon cooling, the liquified encapsulant solidifies. In some embodiments, the encapsulant may be additionally cured in situ to form a transparent solid matrix. The encapsulant adheres to the front side layer 230 and backsheet 228 to form a laminated solar substrate. Suitable encapsulants and other materials, components, and/or configurations for PV cells and/or PV cell modules are described in commonly owned U.S. Patent Application Publication 2015/0155411 which is incorporated herein by reference in its entirety.

As discussed in connection with FIGS. 2A and 2B, PV cell bus bars, tabbing ribbons, and LRF are thin strips of material that may be disposed on the surfaces of the PV cell. As shown in FIG. 2A, a first PV cell 201a is electrically connected to a second cell 201b by tabbing ribbon 211. In the specific embodiment shown in FIG. 2A, the interconnected PV cells 201a,b are directly adjacent to one another, but cells that are not directly adjacent fall within the scope of the present disclosure. In the specific embodiment shown in FIG. 2A, tabbing ribbon 211 extends across the entire length of and over the first cell 201a, extending beyond the edge of the first cell 201a and bending down and under the second cell 201b. Tabbing ribbon 211 then extends across the entire length of and underneath second cell 201b. The LRF 220 is positioned adjacent to the tabbing ribbon 211 on the light receiving side of the module 200. In one embodiment, the LRF film 250 is provided in the form of a continuous strip of flexible polymeric film, which is placed over the entire length of the module 200. In another embodiment, discrete, discontinuous sections of LRF are provided over each PV cell.

FIG. 2B provides a cross sectional view of an embodiment of a portion of a solar substrate 290 in accordance with some embodiments. The solar substrate 290 includes a PV cell 291 with two or more bus bars 224 that extend across the length of the PV cell 291. Finger contacts are fine electrodes that extend across the surface of the PV cell between the PV cell bus bars 224. Finger contacts are not visible in FIG. 2B, but may be observed in FIGS. 1A and 1B. As discussed above, tabbing ribbons may be used to interconnect PV cells in a module. Although not shown in FIG. 2B, the tabbing ribbons may extend fully or partially over the bus bars 224, e.g., between the bus bars 224 and the LRF 220. In various embodiments, the tabbing ribbons and/or bus bars may be less than about 4 mm, less than about 3 mm, less than about 2 mm, or even less than about 1 mm wide.

In some embodiments, the bus bars 224 and/or tabbing ribbons 211 may be disposed over a portion of the length or over substantially the entire length of the PV cell, which is along the y direction indicated in FIGS. 2A and 2B. The LRF 220 may be disposed over one or more of the bus bars 224 and/or tabbing ribbons 211. In some embodiments, the LRF completely overlaps with bus bars and/or tabbing ribbons in order to maximize efficiency of the PV cell. In an alternative embodiment, LRF does not completely overlap bus bars and/or tabbing ribbons. In some embodiments, the LRF is provided in the form of strips which are slightly wider than the bus bars or tabbing ribbons. FIG. 2B shows the LRF 220 overlapping and extending beyond bus bars 224 along the width direction (x direction in FIG. 2B). In some embodiments, the width of each bus bar or tabbing ribbon may be about 1.5 mm and the width of each LRF is about 1.5 mm. In some embodiments, the width of the LRF ranges from about 0.7 mm to about 3.0 mm.

Any type of LRF may be used in the present application including, but not limited to, those described in U.S. Pat. No. 5,994,641 (Kardauskas), U.S. Pat. No. 4,235,643 (Amick), U.S. Pat. No. 5,320,684 (Amick et al), U.S. Pat. No. 4,246,042 (Knasel et al), and U.S. Publication Nos. 2006/0107991 (Baba), and 2010/0200046 (Sauar et al), and 2010/0330726 (Gonsiorawski), the disclosure of each of which is incorporated herein by reference in its entirety. One exemplary LRF is a multilayer construction, as shown in FIG. 2B. Light redirecting film 220 comprises a flexible polymeric layer 234 having a first generally flat major surface 235a and a second generally flat major surface 235b. Structured surface 236 is adjacent to the first major surface 235a of the flexible polymeric layer 234. In some embodiments, the flexible polymeric layer 234 is one of a polyolefin (e.g., polyethylene, polypropylene), polyester (e.g., polyethylene terephthalate (PET)), and polyacrylate (e.g., polymethyl(meth)acrylate (PMMA)). In some embodiments, the structured surface 236 is made of one of a thermoplastic polymer and a polymerizable resin. In some embodiments, the structured surface further comprises a reflective coating 238, such as, a metalized layer (e.g., aluminum, silver).

Polymerizable resins suitable for forming structured surfaces include blends of photoinitiator and at least one compound bearing an acrylate group. Preferably, the resin blend contains a monofunctional, a difunctional, or a polyfunctional compound to ensure formation of a crosslinked polymeric network upon irradiation. Illustrative examples of resins that are capable of being polymerized by a free radical mechanism that can be used herein include acrylic-based resins derived from epoxies, polyesters, polyethers, and urethanes, ethylenically unsaturated compounds, isocyanate derivatives having at least one pendant acrylate group, epoxy resins other than acrylated epoxies, and mixtures and combinations thereof. The term "acrylate" is used herein to encompass both acrylates and methacrylates. U.S. Pat. No. 4,576,850 (Martens) (incorporated herein in its entirety) discloses examples of crosslinked resins that may be used in forming the structured surface of LRF. In some embodiments, the resin is a non-halogenated resin. Some benefits of use of non-halogenated resins include the fact that they are more environmentally friendly and do not corrode metals.

Some embodiments of the LRF include a reflective coating. In some embodiments, the reflective coating is a mirror coating. A reflective coating or a mirror coating may have several advantages. For example, these coatings can provide reflectivity of incident sunlight and thus can block incident sunlight from being incident on the polymer materials (which can degrade due to UV exposure). Any desired reflective coating or mirror coating thickness can be used. Some exemplary thicknesses are measured by optical density or percent transmission. Obviously, thicker coatings block more UV light. However, coatings that are too thick may cause increased stress within the coating, resulting in coating cracking. Additionally, thicker coatings are often less durable when exposed to damp heat testing and/or pressure cooker testing. An LRF may have a reflective or mirror coating thickness of between about 35 nm to about 60 nm, for example.

During the lamination process of the PV cell module, it may be important to maintain registration between the bus bars and/or tabbing ribbons and LRF strips. In one exemplary method of making a PV cell module, the LRF strips attached to the bus bars and/or tabbing ribbons with an adhesive 225 such as a thermally activated or pressure sensitive adhesive. In some embodiments, the thermally activated adhesive is ethylene vinyl acetate polymer (EVA). Other types of suitable thermally activated adhesives include polyolefins. The LRF films are positioned over the PV cell or PV cell module and heat is applied thereto to melt the thermally activated adhesive, effectively bonding the LRF strips to the bus bars, tabbing ribbons, or other inactive regions. In some embodiments, other layers may be laminated or coated onto the PV module (e.g., backsheets, encapsulants, front-side layers) prior to the heating step. The heating step may be carried out using any suitable heating mechanism such as, for example, a heat gun or infrared heater. In some embodiments, the heating mechanism is placed under the laminate construction (e.g., adjacent to the backsheet). In some embodiments, the heating mechanism is placed above the laminate construction (e.g., adjacent to the light directing medium).

In some embodiments, the adhesive is a pressure-sensitive adhesive (PSA). Suitable types of PSAs include, but are not limited to, acrylates, silicones, polyisobutylenes, ureas, and combinations thereof. In some embodiments, the PSA is an acrylic or acrylate PSA. As used herein, the term "acrylic" or "acrylate" includes compounds having at least one of acrylic or methacrylic groups. Useful acrylic PSAs can be made, for example, by combining at least two different monomers (first and second monomers). Exemplary suitable first monomers include 2-methylbutyl acrylate, 2-ethylhexyl acrylate, isooctyl acrylate, lauryl acrylate, n-decyl acrylate, 4-methyl-2-pentyl acrylate, isoamyl acrylate, sec-butyl acrylate, and isononyl acrylate. Exemplary suitable second monomers include a (meth)acrylic acid (e.g., acrylic acid, methacrylic acid, itaconic acid, maleic acid, and fumaric acid), a (meth)acrylamide (e.g., acrylamide, methacrylamide, N-ethyl acrylamide, N-hydroxyethyl acrylamide, N-octyl acrylamide, N-t-butyl acrylamide, N,N-dimethyl acrylamide, N,Ndiethyl acrylamide, and N-ethyl-N-dihydroxyethyl acrylamide), a (meth)acrylate (e.g., 2-hydroxyethyl acrylate or methacrylate, cyclohexyl acrylate, t-butyl acrylate, or isobornyl acrylate), N-vinyl pyrrolidone, N-vinyl caprolactam, an alpha-olefin, a vinyl ether, an allyl ether, a styrenic monomer, or a maleate. Acrylic PSAs may also be made by including cross-linking agents in the formulation.

In some embodiments, the adhesive is selectively applied to the electrical connectors (bus bars or tabbing ribbons), with the width of the LRF strips being equal to or slightly larger than the width of the electrical connectors. Preferably, the adhesive is transparent. Desired transparency is at least 80% transparency to visible light. In some embodiments, the desired transparency is at least 90% to visible light. In other embodiments, the transparent adhesive is applied over the entire surface of the PV cells (e.g., flood coated). The LRF strips are then carefully positioned over, and in registration with, the electrical connectors. The entire structure is then heated to melt the adhesive and ensure adequate bonding of the light directing mediums to the electrical connectors.

Embodiments disclosed herein are directed to systems and methods of applying the thin strips of material to one or more surfaces of a substrate. In embodiments wherein the substrate is a solar substrate, the solar substrate may comprise an individual solar cell or multiple solar cells which are arranged in a solar cell module. The solar substrate may comprise one or more of a PV cell, an encapsulant, a backsheet, and a glass cover sheet. The strips applied to the solar substrate may comprise metal bus bar strips, tabbing ribbons, and/or LRF strips, for example.

It can be challenging to produce and handle thin strips of material formed by longitudinally slitting a wider stock of material into multiple thin strips an subsequently winding the thin strips onto spools for storage. Embodiments disclosed herein are directed to systems and methods that produce the thin strips by cutting the wider stock of material transversely to form thin strips rather than longitudinally slitting the material into highly elongated strips that are wound onto spools for later use.

Figure 3A:
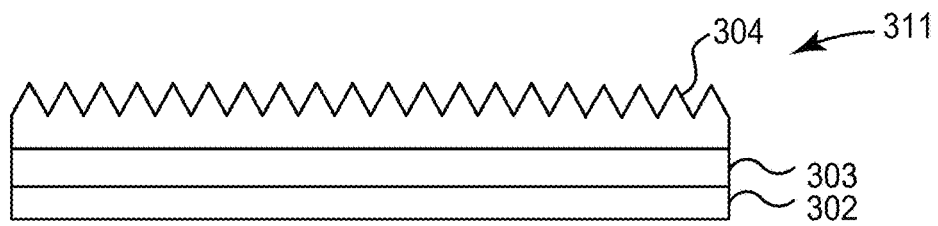
FIG. 3A is a cross sectional illustration of a tape that may be employed by the systems and methods described herein.
Figure 3B:
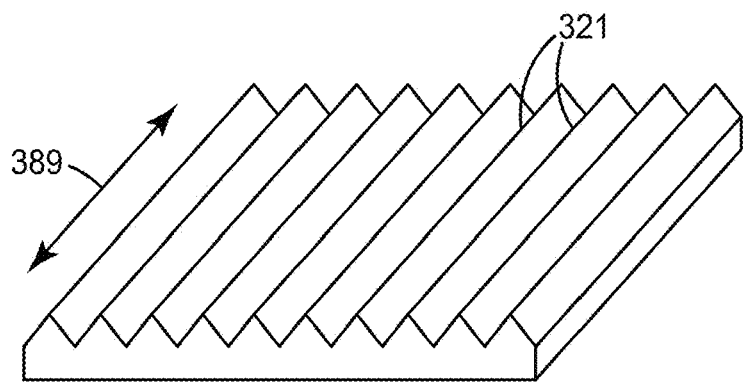
FIG. 3B is a perspective view illustrating linear prisms on a light redirecting film in accordance with some embodiments.
Figure 3C:
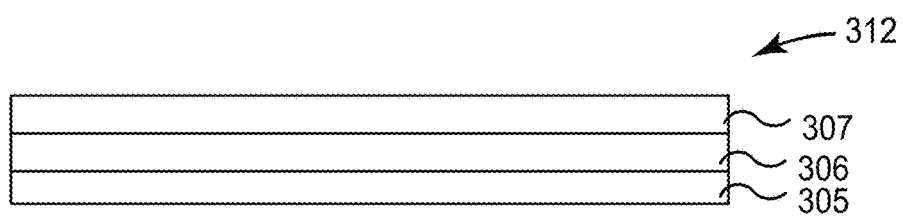
FIG. 3C is a cross sectional illustration of a tape that may be employed by the systems and methods described herein.

FIGS. 3A and 3C are cross sectional illustrations of tapes 311, 312 that may be employed by the systems and methods described herein. Tape 311 is a multilayer structure comprising LRF 304 having a structured surface. The LRF 304 is optionally disposed on an adhesive layer 303 that is optionally covered by a liner 302 that provides a protective film for the adhesive layer. FIG. 3B illustrates a perspective view of the LRF 304 of tape 311. In this example, the LRF 304 comprises multiple prisms 321 that extend linearly along the prism longitudinal axis 389. In general, the longitudinal axis 389 of the prisms of the LRF may be oriented independently of other structures of the substrate. For example, the longitudinal axis 389 of the LRF prisms 321 may be the oriented at any angle with respect to the longitudinal axis of bus bars, tabbing ribbons and/or other solar substrate structures. In various configurations, the longitudinal axis 389 of the LRF prisms 321 may be oriented substantially parallel (at an angle of about 0 degrees) with respect to the longitudinal axis of solar substrate bus bars or tabbing ribbons; the longitudinal axis 389 of the LRF prisms 321 may be oriented substantially perpendicular (at an angle of about 90 degrees) with respect to the longitudinal axis of solar substrate bus bars or tabbing ribbons; or the longitudinal axis 389 of the LRF prisms 321 may be oriented at an angle between 0 and 90 degrees, e.g. about 45 degrees, with respect to the longitudinal axis of solar substrate bus bars or tabbing ribbons.

Tape 312 is suitable for use to form bus bars and/or tabbing ribbons for PV cells. Tape 312 comprises a conductive, e.g., metal, layer 307 optionally disposed on an adhesive layer 306 which optionally may be covered by a liner 305 that provides a protective film for the adhesive layer.

FIG. 3C illustrates a wider material which is referred to herein as a tape 391 wound onto a roll 304. The tape 391 has a length l1 and a width w1, wherein l1$\gg$w1. The tape may have a thickness in a range of about 20 to 500 µm or in a range of about 20 to 120 µm in some embodiments.

Figure 3D:
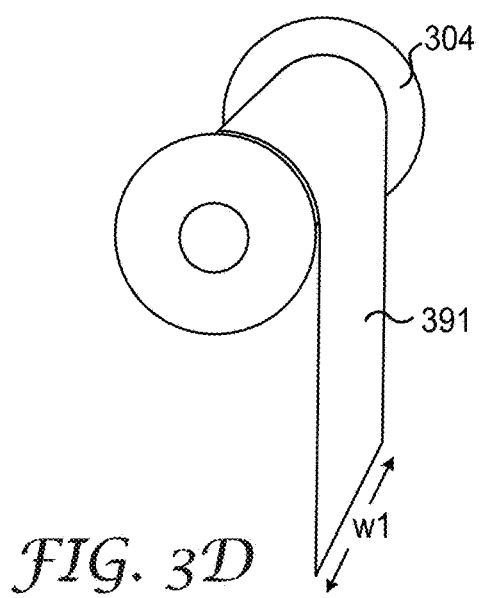
FIG. 3D illustrates a wider material referred to herein as a tape wound onto a roll.
Figure 3E:
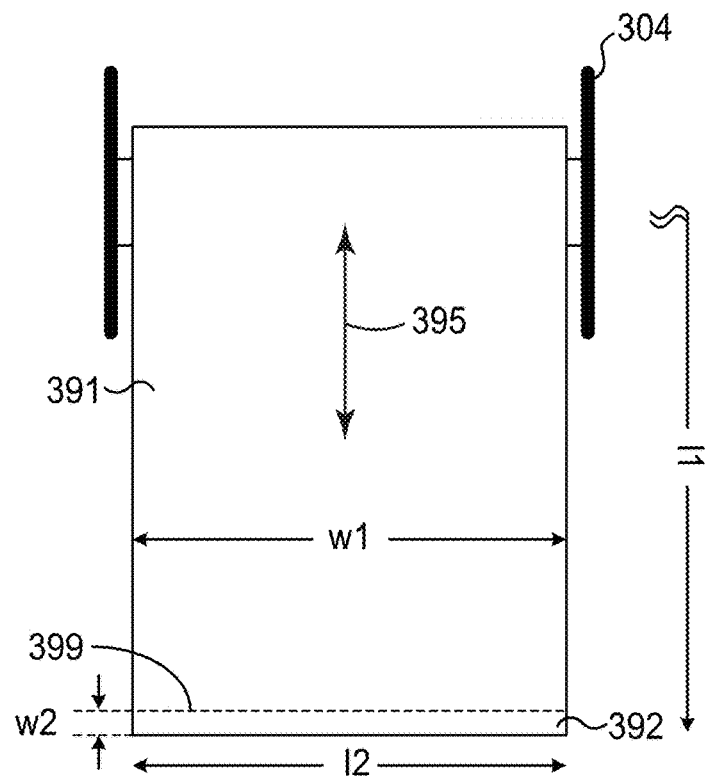
FIG. 3E illustrates cutting the tape transversely across its width to make a strip at an angle of about 90 degrees with respect to a longitudinal axis of the tape in accordance with some embodiments.
Figure 3F:
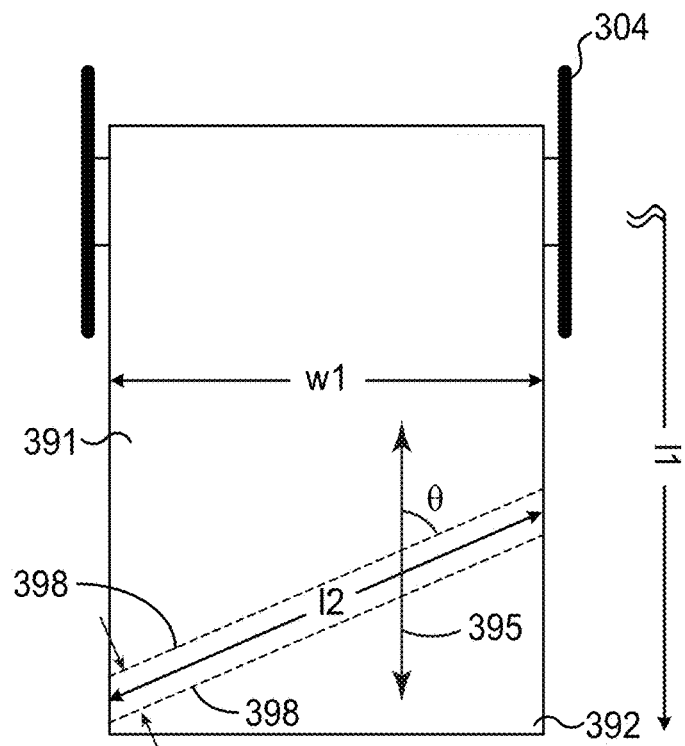
FIG. 3F illustrates cutting the tape transversely across its width to make a strip at an angle other than about 90 degrees with respect to a longitudinal axis of the tape in accordance with some embodiments.

As shown in FIG. 3D, in some embodiments, the tape 391 may be cut transversely along cutting line 399 at about 90 degrees with respect to the longitudinal axis 395 of the tape 391 to produce a strip 392 having a length l2 and a width w2, wherein l2$\approx$w1. As shown in FIG. 3E, in some embodiments, the tape 391 may be cut transversely at an angle $\theta \neq 90$ degrees to the longitudinal axis 395 of the tape 391 along cutting line 398 to produce a strip 393 having a length l2 and a width w2, wherein l2$\geq$w1.

In general the strips may have a variety of geometrical shapes, such as square or rectangular strips. In some configurations, the strips may have a width and/or length of about 3 mm, or less than 3 mm, e.g., about 2 mm, about 1 mm, or even less than 1 mm for example. In some configurations, e.g., for strips are positioned on the front side of a solar substrate, the strips have an aspect ratio l2/w2 of each strip is at least about 20, at least about 50, at least about 75, or at least about 100, for example. In some configurations, e.g., for strips positioned on the back side of a solar substrate, the strips may have an aspect ratio of about 1 or about 5, for example. Strips that do not have parallel sides, e.g., triangular strips or strips having more complex shapes, may be cut by changing the cutting line angle for successive cuts, for example. The ratio of the width of the tape to the width of the strips w1/w2 can be any ratio suitable for the particular application. For example, in some configurations the ratio w1/w2 can be in a range of about 1 to 150 or in a range of about 50 to 100, for example.

Figure 4:
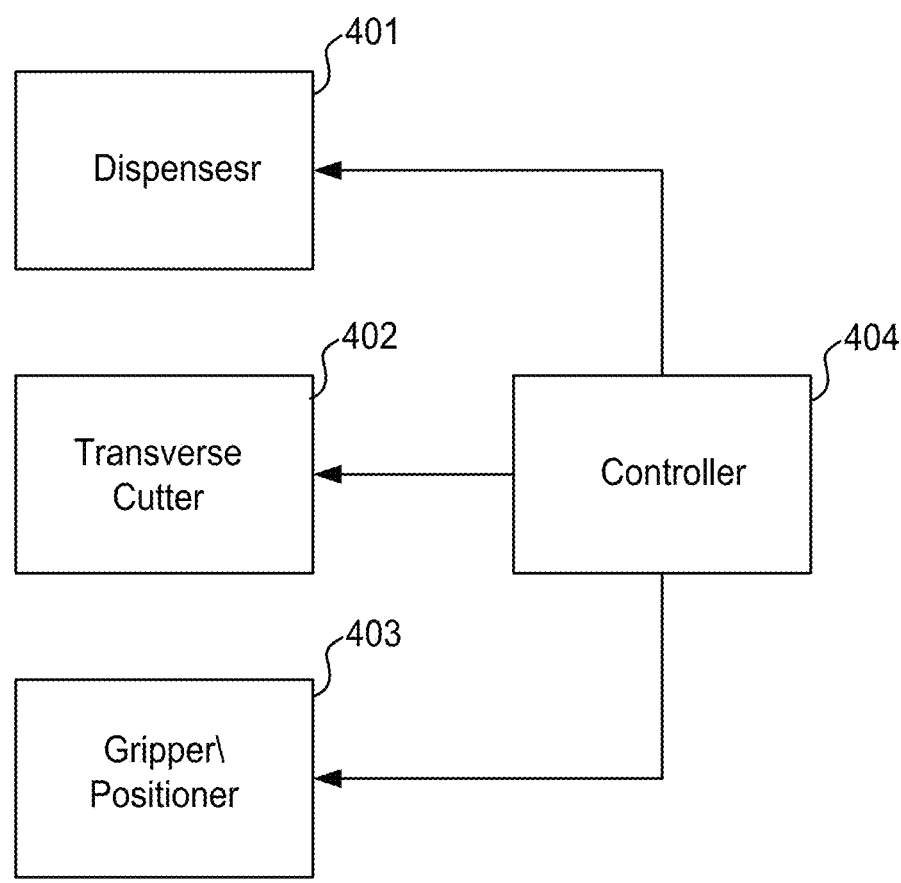
FIG. 4 is a block diagram that conceptually shows a system for applying strips to substrates in accordance with embodiments disclosed herein.

FIG. 4 is a block diagram that conceptually illustrates system 400 for applying strips to substrates in accordance with embodiments disclosed herein. The system 400 includes a dispenser 401 configured to dispense the wider tape. Transverse cutter 402 cuts the tape that is dispensed by the dispenser into strips along the width direction of the tape. Examples of suitable transverse cutters include rotary shear cutters and rotary crush cutters. Gripper/positioner 403 grips the strip of tape during and/or after the strip of tape is cut from the wider tape and positions the strip over and/or onto the surface of the s. The dispenser 401, transverse cutter 402, and gripper/positioner 403 operate under control of an electronic controller 404, which may comprise a microprocessor executing programmed instructions. The electronic controller 404 may receive sensor inputs and produce outputs based on the sensor inputs and the programmed instructions. In some embodiments, the system 400 may provide a semi-automatic or fully automatic subsystem for installing thin strips of material, such as LRF and/or bus bars in a PV cell module fabrication line system that converts individual slices of semiconductor material into a fully functional power converting PV cell or a PV cell module ready installation on a residential or commercial facility.

FIG. 5A shows a more detailed conceptual block diagram that illustrates various feature of a system 500 according to some embodiments. As illustrated in FIG. 5A, the system 500 includes an input spindle 501 on which an input roll 504 of the tape 591 can be mounted. In some embodiments, the tape 591 includes a liner 543 that is removed before the tape 591 is cut into strips. A take up spindle 541 is arranged to hold a waste liner roll 543 for collection of the liner 593 after it is removed from the tape 591. In other embodiments, the tape 591 may not include a liner in which case a take up spindle is not needed. Optionally, in some embodiments, the input spindle 501 is driven by an input spindle motor 503 arranged to rotate the input spindle 501 to advance the tape 591.

In implementations in which the tape 591 includes a liner 593, the liner 593 may be removed from the tape 541 by a peel bar 581. The peel bar 581 can have a radius of curvature at the peel edge 581a that efficiently removes the liner 593 from the tape 591 while allowing for an appropriate tension on the liner 593. The radius of curvature of the peel edge 581a may be different for tapes of differing flexibility. To strip off the liner 593 using a peel bar 581 with peel edge 581a requires the force of adhesion between the tape 591 and the liner 593 to be smaller than the stiffness of the tape 591. This adhesion force is a function of the sum of the liner contact area at the peel edge 581a. The smaller the radius of curvature the lower the contact area and the lower the adhesion force. The radius of curvature determines the location of the edge 581a that the tape 591 detaches from the liner 593. The radius of curvature of the peel edge 581a should be small enough to provide for separation of the liner at a predictable location but not so small as to damage or cut the liner 593. In various embodiments, the radius of curvature of the peel edge 581a may be about 5%-20% of the width w2 of the strip 592, or between 7%-15% of the width of the strip 592, or about 8% of the width of the strip 592.

In some embodiments, the take up spindle 541 is driven by a take up spindle motor 542. The take up spindle motor 542 may be configured to cause rotation of both the take up spindle 541 and the input spindle 501. In this embodiment, as the take up spindle 541 is rotated by the take up spindle motor 542, rotation of the take up spindle 541 applies tension to the liner 593 which is attached to the tape 591. The applied tension on the liner 593 causes advancement of the tape 591 and rotation of the input spindle 501. In some embodiments, the tension on the liner 543 may be controlled by a brake 502 that mechanically engages with the input spindle 501. The brake 502 may be a mechanical friction brake, hydraulic, brake, pneumatic brake, electromagnetic particle brake, or a motor used as a brake. Operation of the brake 502 can be controlled by the control system previously discussed. For example, in some embodiments, the linear tension on the liner 593 is controlled to a range of about 2 to 100 grams per mm of width w2 of the strip 592. In some embodiments, the linear tension on the liner 593 is controlled to a range of about 2 to 10 grams per mm of width w2 of the strip 592.

According to some embodiments, pinch rollers may be used to cause advancement of the tape. In these embodiments, the tape may be threaded between pinch rollers, one of which may be driven by a motor to cause rotation of the input spindle and advancement of the tape.

The input spindle 501, optional input spindle motor 503, take up spindle 541, take up spindle motor 542, electromagnetic brake 502, and peel bar 581 and/or pinch rollers are components of a dispenser 505 that may serve as the dispenser 401 as illustrated in FIG. 4.

FIG. 5A shows a transverse cutter 510 comprising a rotary cutting blade 511 and a rotary anvil 512 that rotates around the z axis as they move in the transverse direction, along the y axis as shown in FIG. 5A. In this embodiment, the rotary anvil 512 is rotated by an anvil motor 513.

The rotary anvil 512 turns the cutting tool 510 by friction between planar surfaces of the rotary cutting blade 511 and the anvil 512. The rotary anvil 512 is mechanically coupled to the anvil motor shaft 513a which is rotated around the z axis by the anvil motor 513. The rotary cutting blade 511, the rotary anvil 512, and the anvil motor 513 are mechanically mounted on a cutter base 515 which is moved translationally along the y axis by the transverse cutter linear actuator 514.

In some embodiments, cutting the tape may be implemented by rotating the rotary cutting blade at a rotation rate that is independent of the linear translation of the rotating cutting blade. In some embodiments, the rotary cutting blade 511 and anvil 512 rotate at a rotation rate that is faster than the linear translation of the rotary cutting blade 511. Thus, the tangential speed of the rotating cutting blade is greater than the lineal motion of the cutting blade. For example, the rotation rate of the cutting blade may be in a range of 2%-10% greater, e.g., about 5% greater, than the linear translation of the rotary cutting blade.

The gripper/positioner 520 includes gripper arm 521 configured to grip the strip 592 after the strip 592 is cut from the tape 591 and during positioning of the strip 592 over the surface 594a of the substrate 594. The gripper 520 may comprise a vacuum gripper and/or a mechanism, such as a clamp, that mechanically grips the strip, for example. As shown in FIGS. 5A and 5B, in some embodiments the gripper arm 521 includes a surface 522 that faces the strip 592. In some embodiments, the surface 522 may be a compliant surface, e.g., comprising a polymer and/or adhesive and/or other material. For example, the surface 522 of the gripper arm 521 may comprise a compliant material having a durometer hardness between about 10 to 80 Shore A, or 20 to 60 shore A, or 20 to 30 shore A. The durometer value selected for a particular implementation may depend on temperature of the substrate and peel adhesion of the strip.

In some embodiments, the rotary anvil 512 is arranged relative to the gripper surface 522 such that transverse movement of the anvil 512 across the strip 592 applies a force to the second surface 592b of the strip 592 that pushes the first surface of the strip 592a against the gripper surface 522 as the strip 592 is being cut from the tape 591 (along the x axis shown in FIG. 5A).

In some embodiments, a vacuum is produced at the gripper surface 522 by a vacuum pump 525 and vacuum hose 524 fluidically attached to vacuum holes 522a that extend through the gripper surface 522. As illustrated in FIG. 5B, the vacuum holes 522a can be positioned on the gripper surface 522 to apply an amount of vacuum to the first surface 592a of the strip 592 to hold the strip 592 during cutting and/or positioning of the strip 592. For example, in some embodiments, the vacuum holes 522a may be positioned on the gripper surface 522 directly under the strip 592. In some embodiments, the vacuum holes 522a are positioned in a relatively narrow area of the gripper surface 522 corresponding to an area of the first surface of the strip 592. The vacuum holes 522a are designed to funnel vacuum under the strip 592. In some embodiments, the vacuum holes have diameter in a range of about 0.02 cm (0.008 inches) to about 0.05 cm (0.020 inches). For example, in some embodiments, a single row of 0.02 cm (0.008 inch) diameter holes may be spaced about 0.5 cm (0.20 inches) apart. A ratio of the diameter of the vacuum holes to the width of the strip may be in a range of about 10% to about 50%, for example. The spacing of the vacuum holes 522a across the gripper surface 522 may be in a range of about 2 to 5 times the diameter of the vacuum holes 522a.

The gripper/positioner 520 includes one or more actuators 523a,b configured to move the strip 592 from a first position to a second position. The strip 592 is in the first position during and immediately after cutting and is in the second position when the strip 592 is positioned to be installed on the substrate 594 with the second surface of the strip 592b oriented toward the surface of the substrate 594. In some embodiments the system includes a rotational actuator 523a that rotates the gripper arm 521 around the length axis of the gripper arm (the y axis in FIG. 5A), which is also the length axis of the strip 592. Rotation of the gripper arm 521 also rotates the strip 592 gripped by the gripper arm. For example, the gripper arm 521 and the strip 592 may be rotated about 90 degrees. The system may also include a translational actuator 523b that moves the gripper arm 521 translationally along the z axis to position the strip 592 on or over the substrate 594.

In some embodiments, an automated system may include a conveyer 596 configured to successively move substrates 594 into position for placement of the strips. In embodiments wherein the strips 592 are attached to the substrate 594 by a thermally activated adhesive, a heater 597 may be positioned to heat the substrates 594 to facilitate adhesive attachment of the strips 592 to the substrate 594. The process of advancing the tape, cutting a strip, gripping the strip, positioning the strip on the substrate and releasing the strip may be considered a cycle of the system. The system 500 can have the capability of implementing multiple cycles at a rate of about 0.5 to 2 cycles per second, for example.

The system 500 includes controller 570 configured to control the operation of the dispenser, cutter, and gripper/positioner. In some embodiments, the controller also controls a movement system 551 configured to move one of more system components, e.g., the gripper/positioner 520, transverse cutter 510, and/or dispenser 505 rotationally around and/or translationally along x and y axes orthogonal to each other and to the z axis normal to the surface of the substrate 594 to place multiple strips in multiple locations, respectively, over the surface of substrate 594. For example, in embodiments wherein the substrate 594 is a solar substrate, the system may place the strips in multiple locations in different x,y locations on a single PV cell or in multiple locations of a module comprising multiple PV cells.

Figure 5:
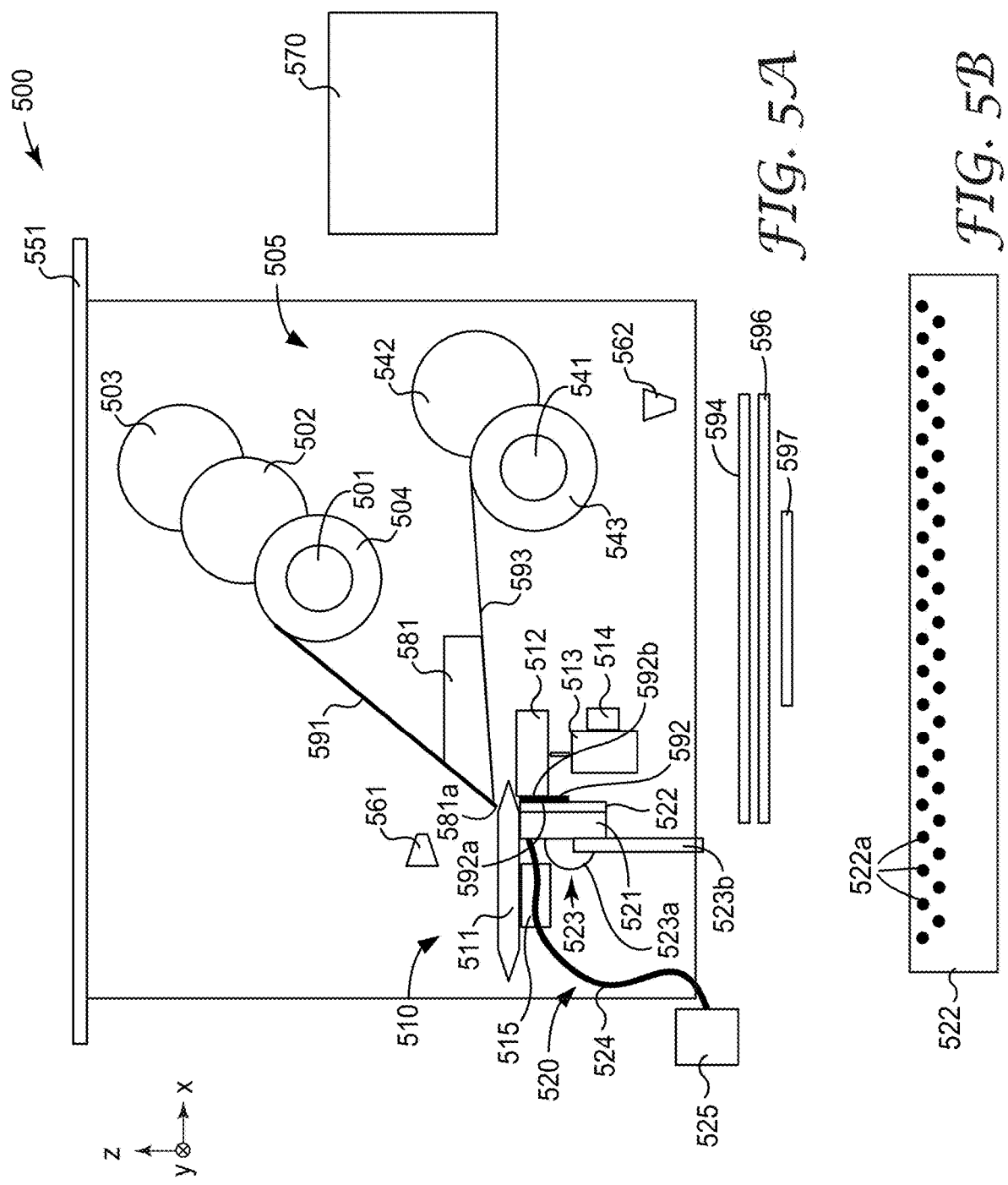
FIG. 5A shows a more detailed block diagram of a system in accordance with some embodiments.
FIG. 5B shows a gripper arm including vacuum holes in accordance with some disclosed embodiments.

In some embodiments, the system 500 may be automated to cut strips of various different widths and/or shapes and to place these strips at various locations in the xy plane on the surface of the substrate. The outputs of one or more positioning sensors 561, 562, 563 may be coupled to the control system 570 to facilitate positioning control for dispensing the tape 591 according to the desired strip widths and/or for positioning the strip 592 relative to the substrate 594. In FIG. 5, sensor 561 is arranged to detect the position of the tape; sensor 562 is arranged to detect the position of the substrate 594; and sensor 563 is a sensor arranged to detect the position of the strip 592 while the strip 592 is gripped by the gripper 521. Each sensor may comprise proximity sensor, an optical sensor a vision sensor, and/or other type of sensor, for example. In some embodiments, the tape 591, the strips 592 the substrate 594 and/or other system components may include fiducials that serve as reference locations for system operations including dispensing the tape 591 and/or positioning the strips 592 on the substrate 594.

Figure 6:
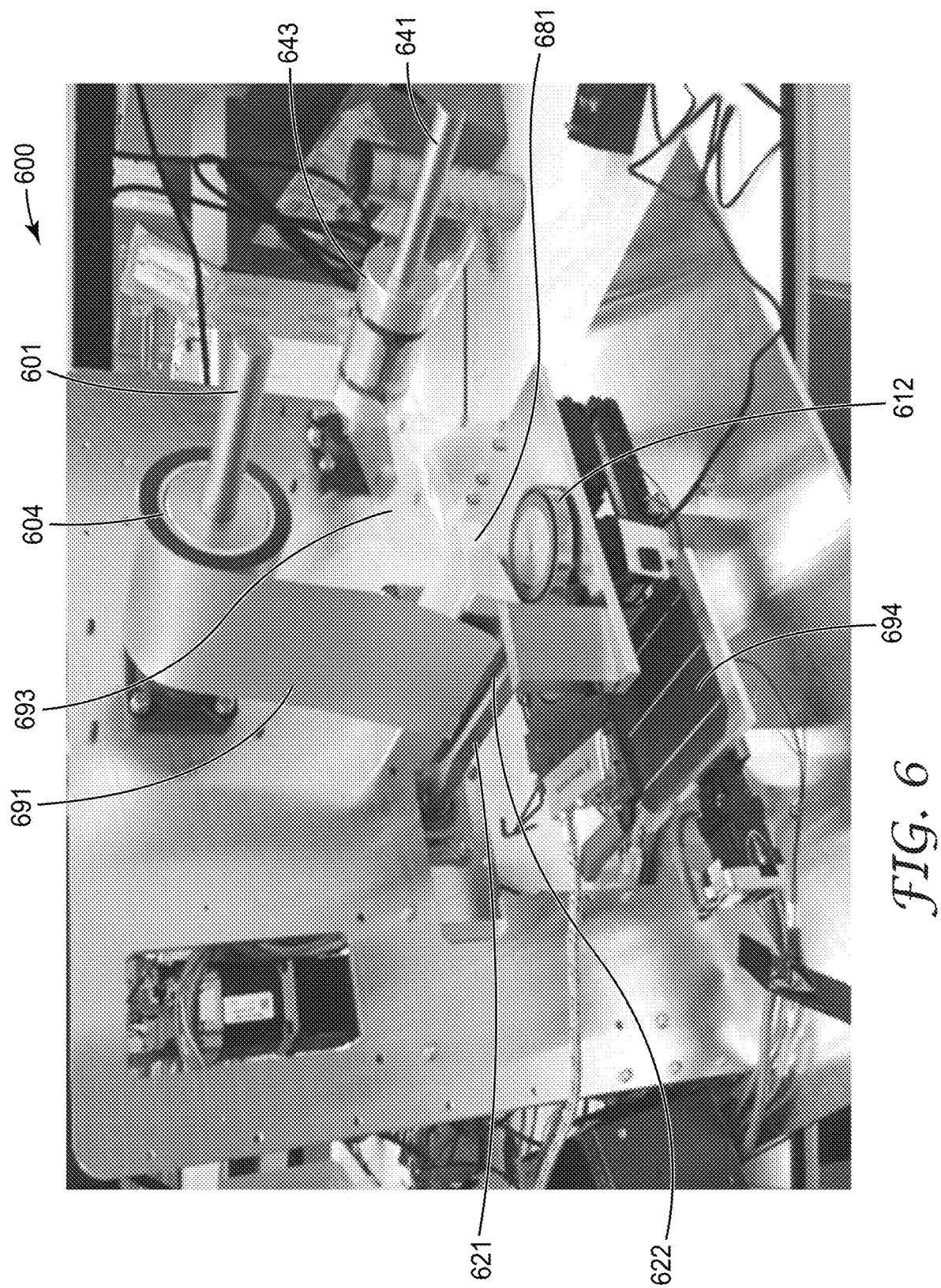
FIG. 6 shows a photograph of a system in accordance with some embodiments.
Figure 7:
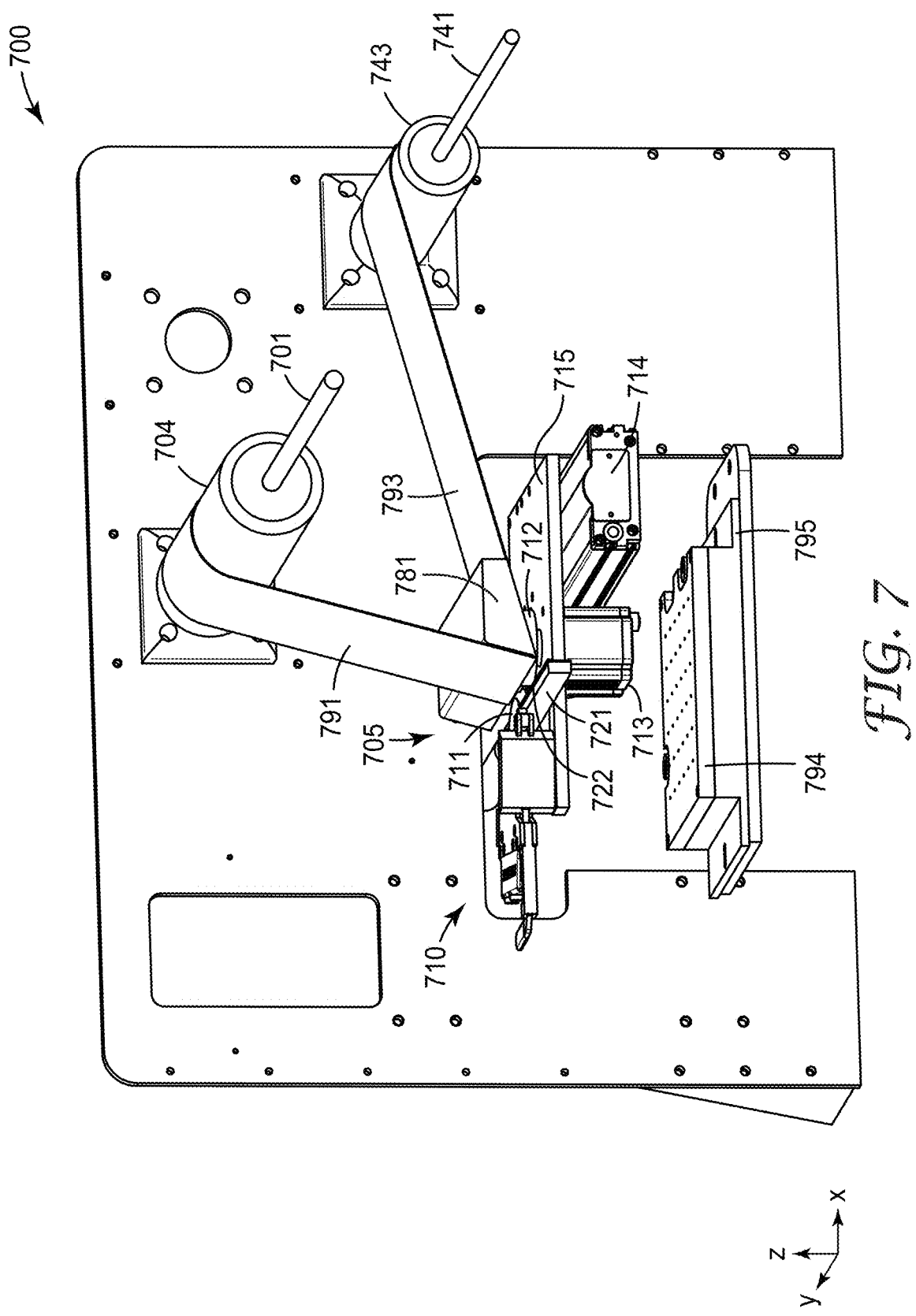
FIGS. 7 through 10 are perspective views illustrating various portions of a system in accordance with some embodiments.
Figure 8:
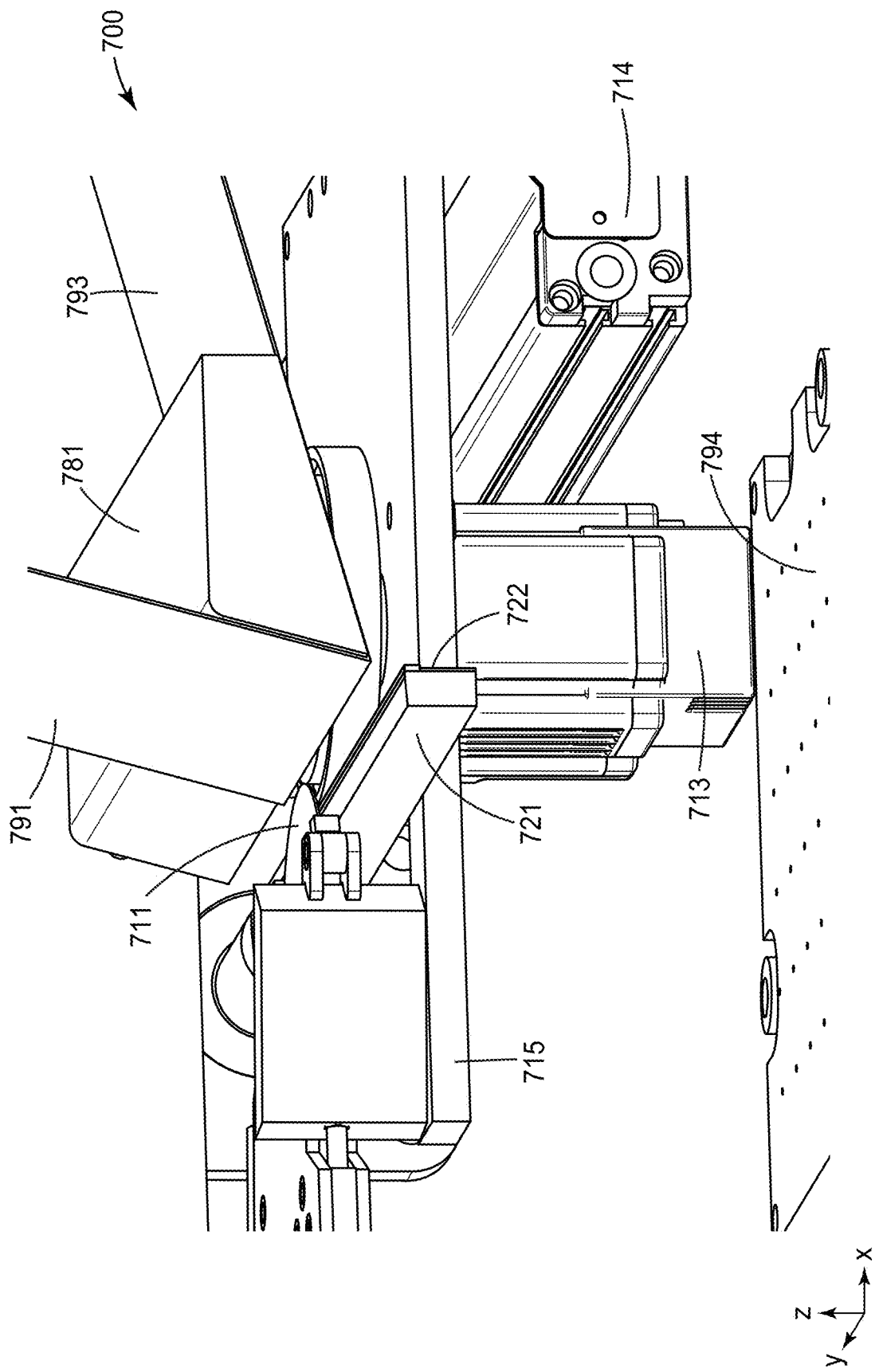
Figure 9:
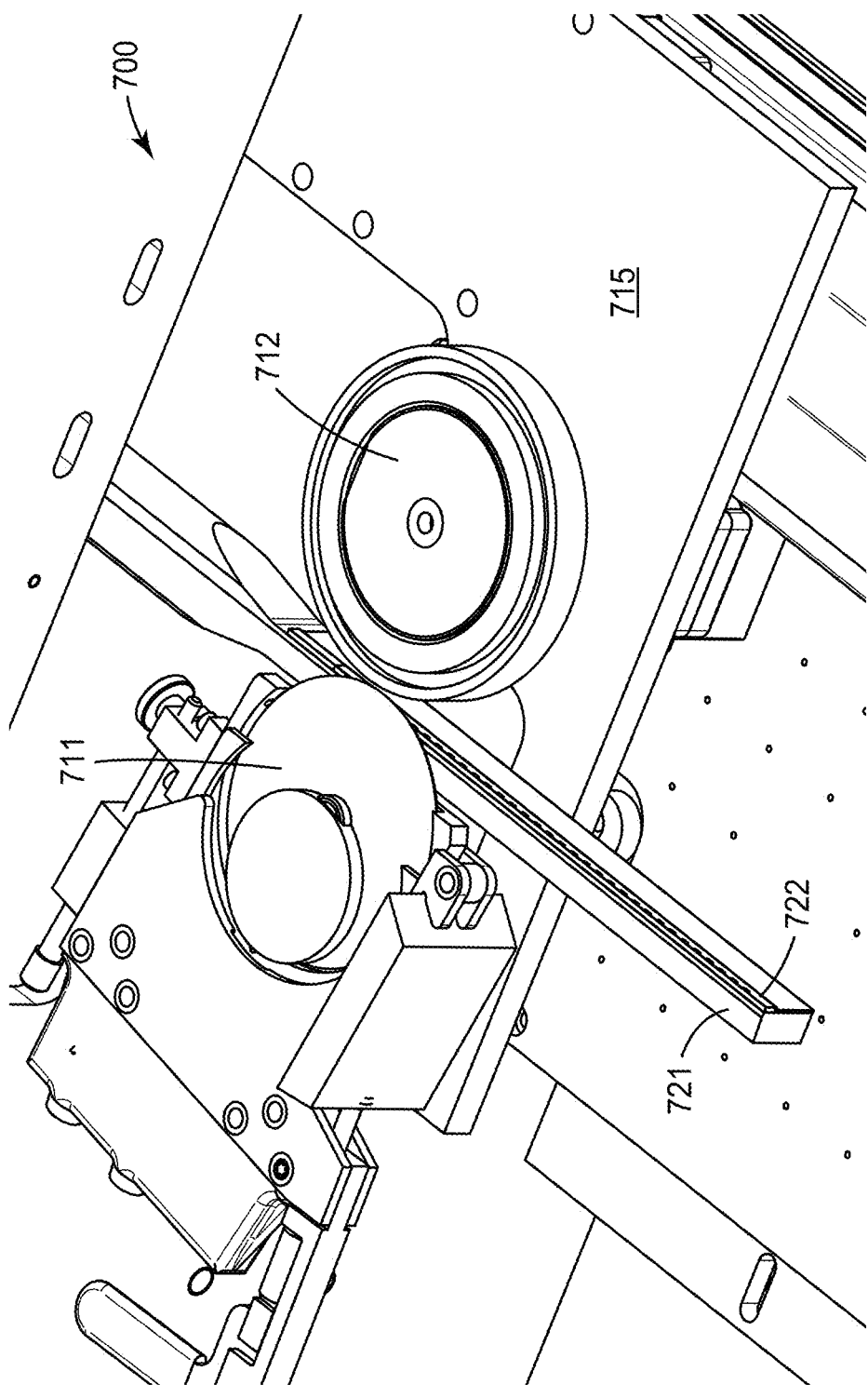
Figure 10:
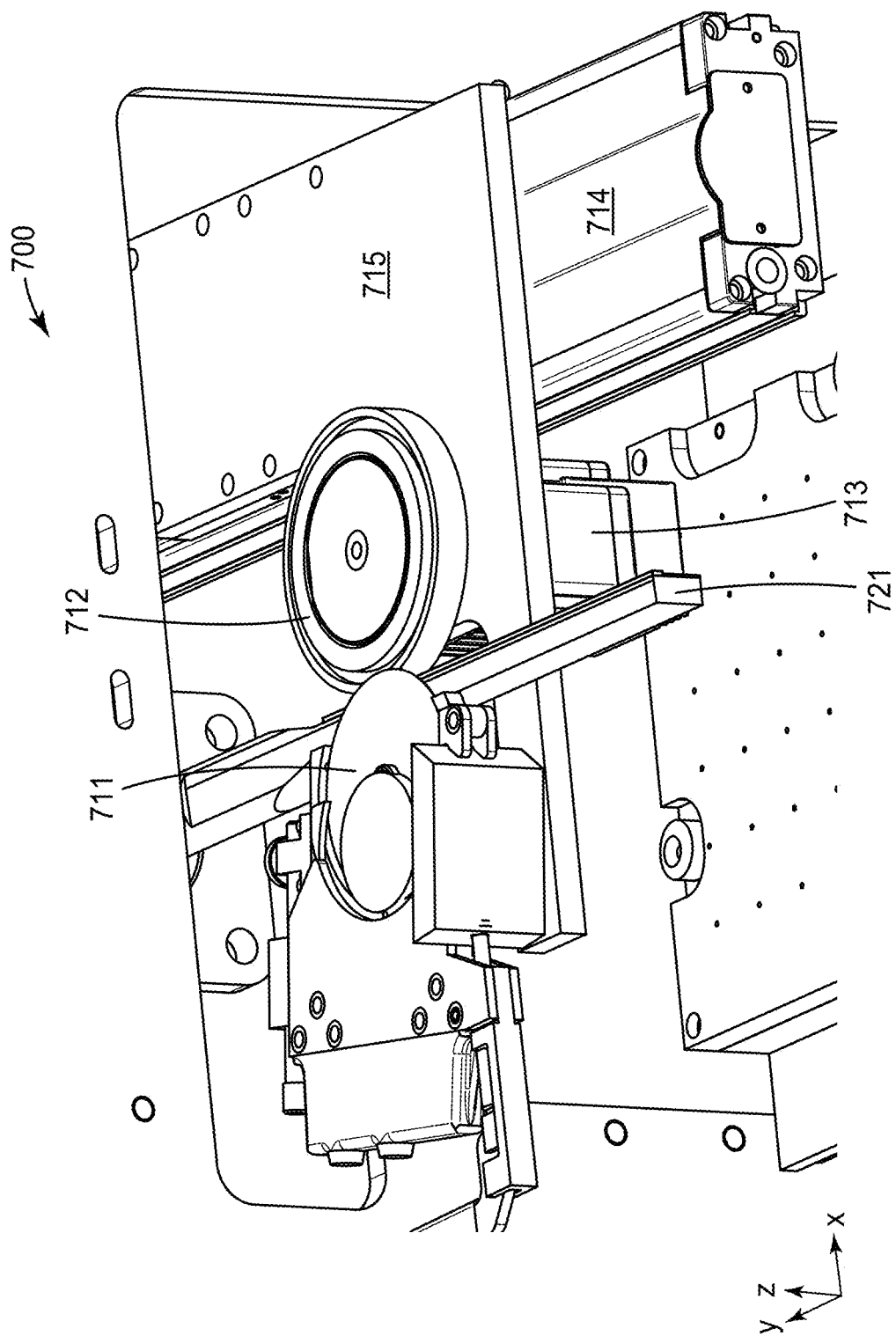

FIG. 6 is a photograph of a system 600 according to some embodiments. Some of the components discussed above are visible in the photograph of FIG. 6, including the input spindle 601, input tape roll 604, tape 691, take up spindle 641, waste liner roll 643, waste liner 693, peel bar 681, rotary anvil 612, gripper arm 621, gripper arm surface 622, and solar substrate 694.

FIGS. 7 through 10 are perspective views illustrating various portions of a system 700 in accordance with some embodiments. The system 700 includes a stage 795 upon which a PV cell 794 can be held, e.g., by vacuum. FIGS. 7-10 illustrates in more detail components of the dispenser 705 including the peel bar 781, input spindle 701, input roll 704, take up spindle 741, and waste liner roll 743. Also illustrated are the tape 791 and liner 793. Components of the transverse cutter 710 are shown in more detail in FIGS. 7 through 10. The transverse cutter 710 includes the rotary cutting blade 711 and rotary anvil 712. The rotary anvil 712 is mechanically coupled to the shaft of the anvil motor 713 that rotates around the z axis. The rotary cutting blade 711, the rotary anvil 712, and the anvil motor 713 are mechanically mounted on a cutter base 715 that is moved translationally along the y axis by the y axis actuator 714. FIGS. 7 through 10 also show the gripper arm 721 and surface 722.

Figure 11A:
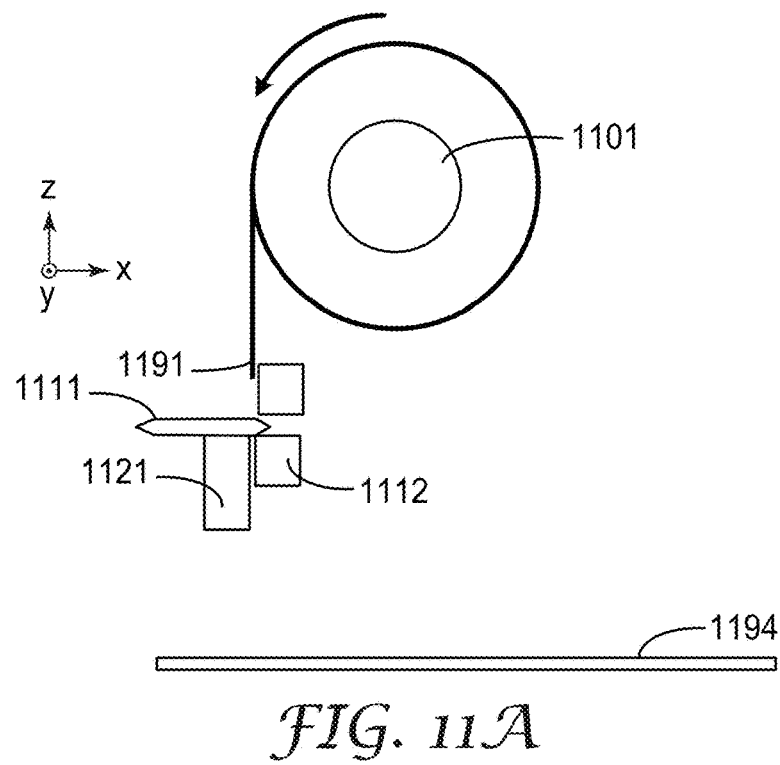
FIGS. 11A through 11F conceptually depict a process of cutting and positioning narrow strips on a substrate according to some embodiments.
Figure 11B:
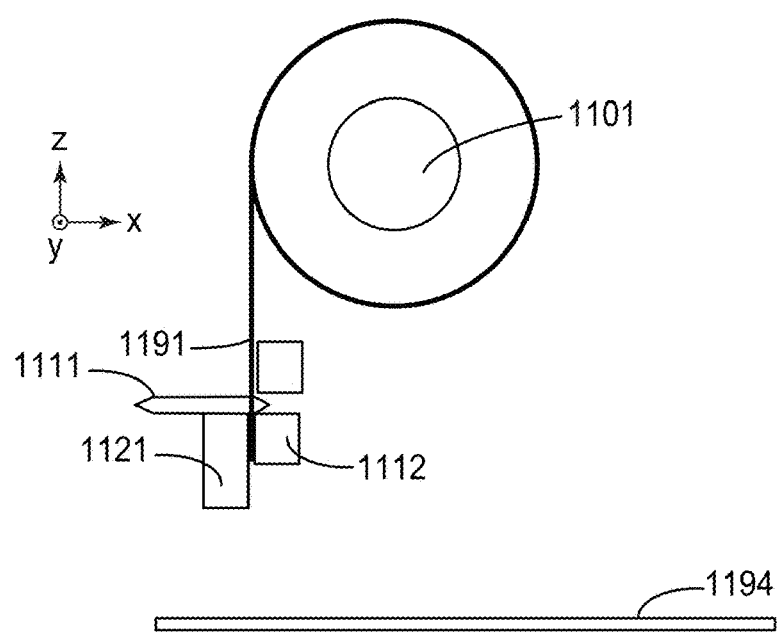
Figure 11C:
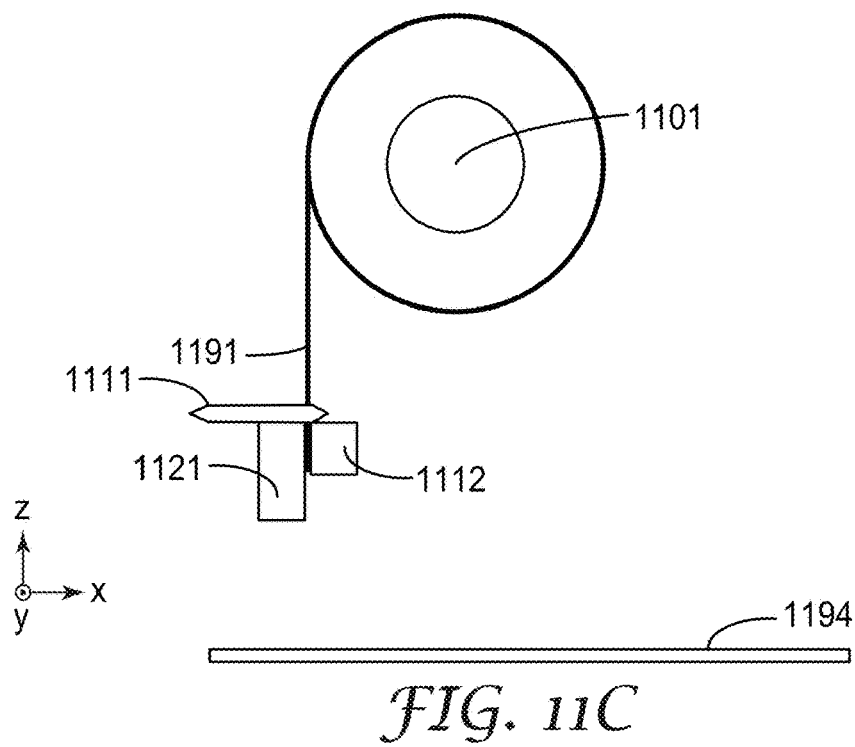
Figure 11D:
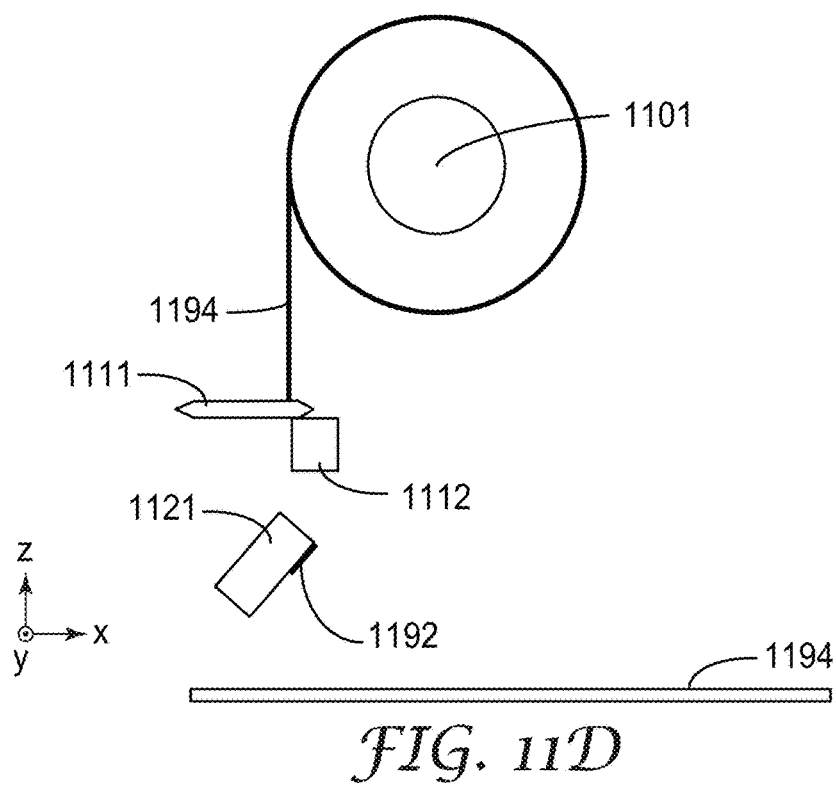
Figure 11E:
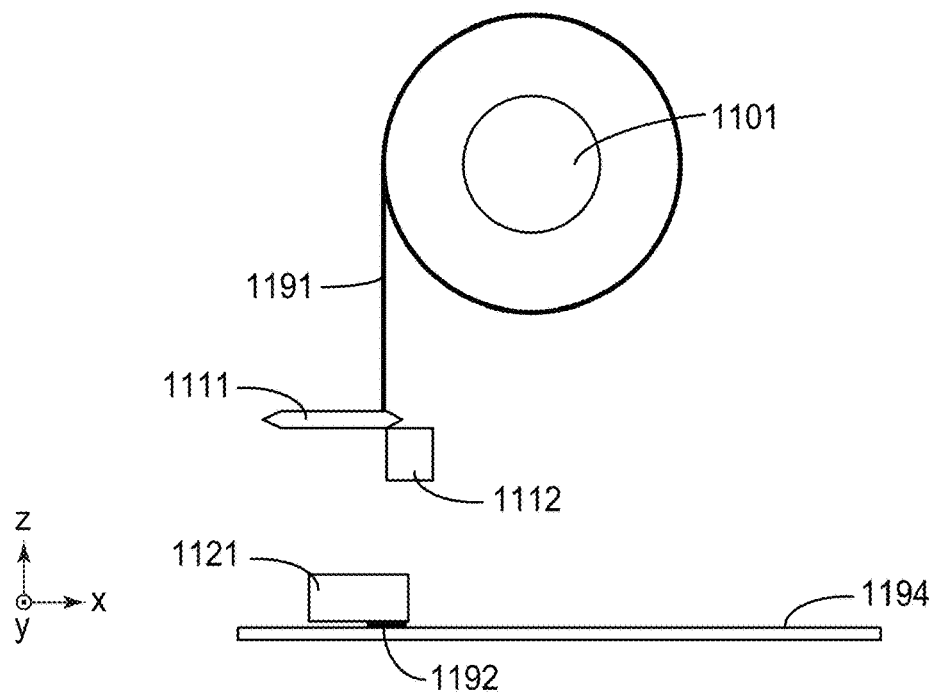
Figure 11F:
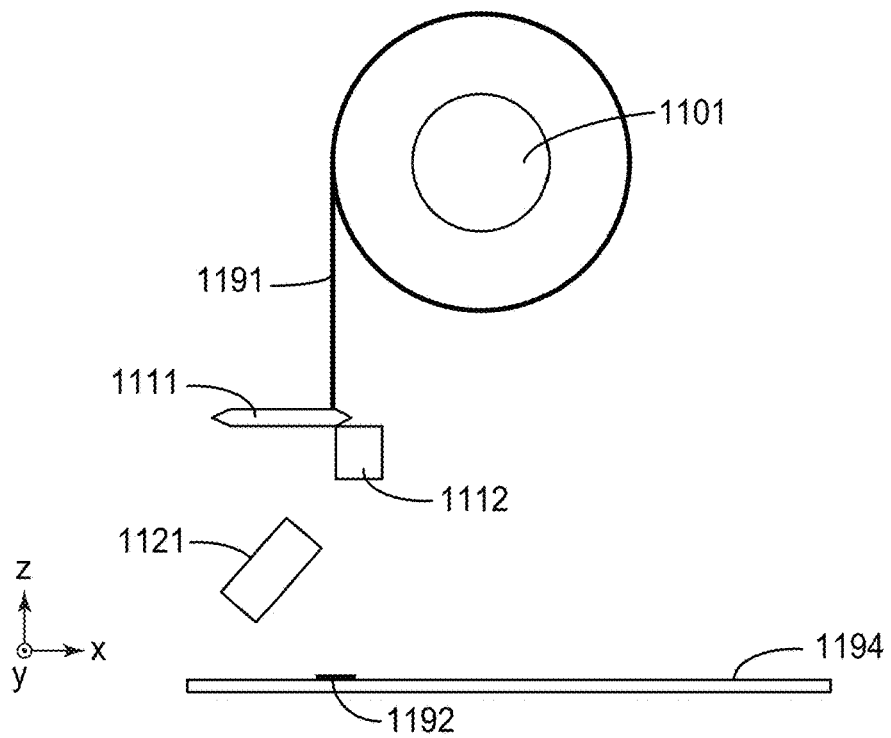
Figure 12:
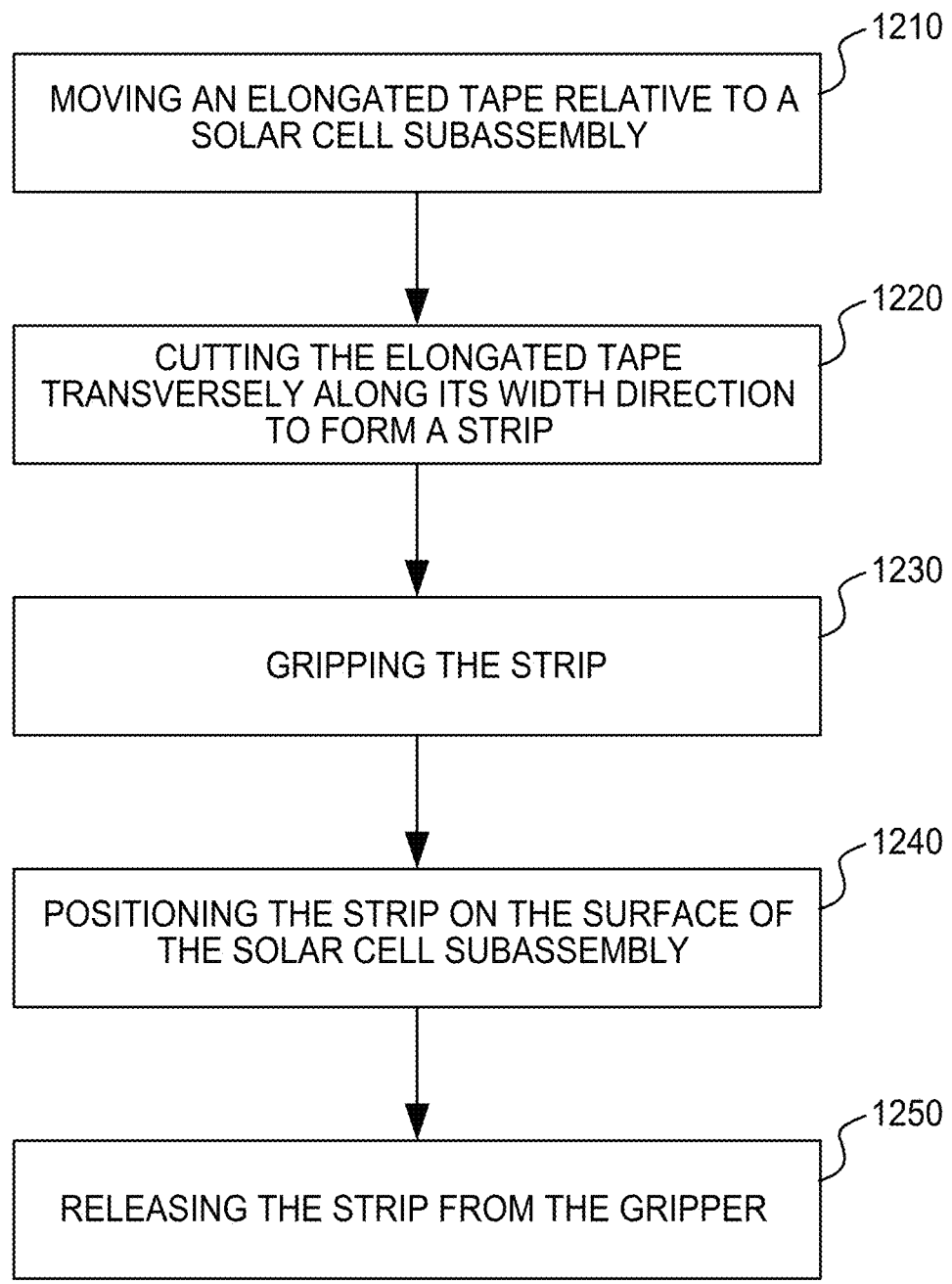
FIG. 12 is a flow diagram illustrating a method of cutting and placing narrow strips on a substrate in accordance with some embodiments.

A method of attaching narrow strips to a substrate is described in conjunction with the conceptual diagrams of FIGS. 11A through 11F and the flow diagram of FIG. 12. FIGS. 11A and 11B show advancement 1210 (see FIG. 12) of the tape 1191 relative to the substrate 1194. In the illustrated embodiment, rotation of the input spindle 1101 as indicated by arrow 1199 allows the tape 1191 to advance generally along the z axis between the peel bar 1181 and gripper arm 1121 placing the tape in position for cutting as shown in FIG. 11B. A liner, if present, may be removed from the tape by the peel bar 1181 and wound on a waste liner spool as the tape is advanced toward the substrate. Removal of the liner may occur before the transverse cutting of the tape.

FIG. 11C shows the tape as it is cut 1220 transversely along its width direction (the y axis in FIG. 11C) to form a strip 1192 which is gripped 1230 by the gripper arm 1121. As the rotary cutting blade 1111 and rotary anvil 1112 move together transversely along the y axis to cut the tape 1191, the anvil 1112 pushes the strip 1192 against the gripper arm 1121. The gripper arm 1121 may be fluidically coupled to a vacuum/pressure pump that applies a vacuum to the strip 1192 through orifices in the gripper arm to grip 1130 the strip 1192 against the surface of the gripper arm 1121.

After the strip 1192 is cut transversely from the tape 1191, the gripper arm 1121 moves to position 1140 the strip 1192 relative to the substrate 1194. As shown in FIG. 11D, positioning the strip 1192 may involve rotating the gripper arm 1121 and the strip 1192 around the y axis and moving the strip along the z axis. Positioning 1140 the strip may involve placing the strip onto the surface of the substrate as illustrated in FIG. 11E. The strip 1192 is then released 1250 from the gripper arm 1121 and the gripper arm 1121 returns to its position in FIG. 11A. In some embodiments, releasing the strip 1192 can be accomplished by reducing the vacuum applied to the strip or by applying a positive pressure through the orifices of the gripper arm 1121.

Embodiments disclosed herein include:

Embodiment 1

A method comprising:
advancing an elongated tape having length l1 and width w1 with l1>w1 relative to a surface of a substrate;
cutting the elongated tape transversely along the width w1 of the tape using a cutting tool, the strip having a first surface and an opposing second surface, the cutting producing a strip having length l2 and width w2, wherein l2=w1, a portion of the cutting tool pushing the first surface of the strip against a gripper while cutting the tape;
holding the first surface of the strip against the gripper while positioning the second surface of the strip on the surface of the substrate; and
releasing the strip from the gripper.

Embodiment 2

The method of embodiment 1, wherein holding the strip comprises vacuum gripping the strip.

Embodiment 3

The method of embodiment 2, wherein releasing the strip comprises reducing the vacuum that holds the first surface of the strip to the gripper.

Embodiment 4

The method of embodiment 2, wherein releasing the strip comprises applying positive gas pressure to the strip through the gripper.

Embodiment 5

The method of any of the embodiments 1 through 4, wherein holding the strip comprises mechanically gripping the strip.

Embodiment 6

The method of any of the embodiments 1 through 5, wherein positioning the strip comprises rotating the strip around its length axis before placing the second surface of the strip on the surface of the solar cell assembly.

Embodiment 7

The method of embodiment 6, wherein rotating the strip comprises rotating the strip about 90 degrees around its length axis.

Embodiment 8

The method of any of the embodiments 1 through 7, wherein positioning the strip comprises translationally moving the strip along an axis normal to the surface of the substrate.

Embodiment 9

The method of any of embodiments 1 through 8, wherein w1/w2 is in a range of 1 to 150.

Embodiment 10

The method of any of the embodiments 1 through 8, wherein w1/w2 is in a range of 50 to 100.

Embodiment 11

The method of any of the embodiments 1 through 10, wherein the tape comprises a metal film.

Embodiment 12

The method of embodiment 11, wherein the tape further comprises an adhesive layer.

Embodiment 13

The method of embodiment 12, wherein the tape further comprises a protective liner for the adhesive layer.

Embodiment 14

The method of any of the embodiments 1 through 10 wherein the tape comprises a light redirecting film.

Embodiment 15

The method of embodiment 14, wherein the light redirecting film comprises light redirecting prisms.

Embodiment 16

The method of embodiment 15, wherein the tape further comprises an adhesive layer.

Embodiment 17

The method of embodiment 16, wherein the tape further comprises a protective film for the adhesive layer.

Embodiment 18

The method of any of the embodiments 1 through 10, wherein:
the tape comprises a light redirecting film having linear prisms aligned along a prism longitudinal axis; and positioning the strip comprises positioning the strip independently of the prism longitudinal axis.

Embodiment 19

The method of any of the embodiments 1 through 18, wherein a thickness of the tape is in a range of about 20 to 500 μm or in a range of about 20 to 120 μm.

Embodiment 20

The method of any of the embodiments 1 through 19, wherein w2 is less than about 3 mm.

Embodiment 21

The method of any of the embodiments 1 through 20, further comprising removing a liner from the tape.

Embodiment 22

The method of embodiment 21, wherein removing the liner comprises removing the liner while advancing the tape relative to the surface of the substrate.

Embodiment 23

The method of embodiment 21, wherein removing the liner comprises removing the liner before cutting the tape.

Embodiment 24

The method of any of the embodiments 1 through 23, wherein cutting the tape comprises moving a rotating cutting blade and an anvil transversely across the width of the tape.

Embodiment 25

The method of embodiment 24, wherein moving the rotating cutting blade comprises rotating the rotating cutting blade at a rotation rate that is faster than a linear translation of the rotating cutting blade.

Embodiment 26

The method of embodiment 24, wherein cutting the tape comprises rotating the rotating cutting blade at a rotation rate that is independent of a linear translation of the rotating cutting blade.

Embodiment 27

The method of embodiment 24, wherein a tangential speed of the rotating cutting blade is greater than lineal motion of the rotating cutting blade.

Embodiment 28

The method of any of embodiments 1 through 27, further comprising translationally moving the gripper along first and second axes (x,y) orthogonal to each other and to an axis (z) normal to the surface of the substrate to position the second surface of the strip.

Embodiment 29

The method of any of the embodiments 1 through 28, wherein:

advancing and cutting the elongated tape comprises advancing and cutting to produce multiple strips; and positioning includes positioning the multiple strips respectively at multiple locations of the substrate.

Embodiment 30

The method of any of the embodiments 1 through 29, wherein:

the strip comprises an adhesive layer; and further comprising heating the substrate to thermally activate the adhesive layer.

Embodiment 31

The method of any of the embodiments 1 through 30, wherein:

advancing the tape, cutting the tape transversely, holding the strip against the gripper while positioning the strip on the surface of a substrate, and releasing the strip from the gripper comprises a cycle; and further comprising implementing multiple cycles at a rate of about 1 cycle per second.

Embodiment 32

A method comprising:

advancing an elongated tape having length l1 and width w1 with l1>w1 relative to a surface of a solar substrate;

cutting the elongated tape transversely along the width w1 of the tape using a cutting tool to produce a strip having length l2 and width w2, where l2=w1, the strip having a first surface and an opposing second surface, a portion of the cutting tool pushing the first surface of the strip against a gripper while cutting the tape;

holding the first surface of the strip against the gripper while positioning the second surface of the strip on the surface of the solar substrate; and releasing the strip from the gripper.

Embodiment 33

The method of embodiment 32, wherein the solar substrate comprises one or more of a photovoltaic cell, an encapsulant, a backsheet, and a glass cover.

Embodiment 34

The method of any of the embodiments 32 through 33, wherein holding the strip comprises vacuum gripping the strip.

Embodiment 35

The method of any of the embodiments 32 through 34, wherein releasing the strip comprises reducing the vacuum that holds the first surface of the strip to the gripper.

Embodiment 36

The method of any of embodiments 32 through 35, wherein releasing the strip comprises applying positive gas pressure to the strip through the gripper.

Embodiment 37

The method of any of embodiments 32 through 36, wherein holding the strip comprises mechanically gripping the strip.

Embodiment 38

The method of any of embodiments 32 through 37, wherein positioning the strip comprises rotating the strip around its length axis before placing the second surface of the strip on the surface of the solar cell assembly.

Embodiment 39

The method of embodiment 38, wherein rotating the strip comprises rotating the strip about 90 degrees around its length axis.

Embodiment 40

The method of any of embodiments 32 through 39, wherein positioning the strip comprises translationally moving the strip along an axis normal to the surface of the substrate.

Embodiment 41

The method of any of embodiments 32 through 40, wherein w1/w2 is in a range of 1 to 150.

Embodiment 42

The method of any of embodiments 32 through 41, wherein w1/w2 is in a range of 50 to 100.

Embodiment 43

The method of any of embodiments 32 through 42, wherein the strip is positioned on a front side of the solar substrate and an aspect ratio of the strip, l2/w2, is at least about 20, at least about 50, at least about 75, or at least about 100.

Embodiment 44

The method of any of embodiments 32 through 43, wherein the strip is positioned on a back side of the solar substrate and an aspect ratio of the strip, l2/w2, is about 1 or about 5.

Embodiment 45

The method of any of embodiments 32 through 44, wherein the tape comprises a metal film.

Embodiment 46

The method of any of embodiments 32 through 45, wherein the tape comprises an adhesive layer.

Embodiment 47

The method of embodiment 46, wherein the tape further comprises a protective liner for the adhesive layer.

Embodiment 48

The method of any of embodiments 32 through 36, wherein the tape comprises a light redirecting film.

Embodiment 49

The method of embodiment 48, wherein the light redirecting film comprises light redirecting prisms.

Embodiment 50

The method of embodiment 49, wherein:
the light redirecting film comprise linear prisms aligned along a prism longitudinal axis; and
positioning the strip comprises positioning the strip independently of the prism longitudinal axis.

Embodiment 51

The method of any of embodiments 32 through 50, wherein a thickness of the tape is in a range of about 20 to 500 µm or in a range of about 20 to 120 µm.

Embodiment 52

The method of any of embodiments 32 through 51, wherein w2 is less than about 3 mm.

Embodiment 53

The method of any of embodiments 32 through 52, further comprising removing a liner from the elongated tape.

Embodiment 54

The method of embodiment 53, wherein removing the liner comprises removing the liner while advancing the tape relative to the surface of the substrate.

Embodiment 55

The method of embodiment 53, wherein removing the liner comprises removing the liner before cutting the tape.

Embodiment 56

The method of any of embodiments 32 through 55, wherein cutting the tape comprises moving a rotating cutting blade and an anvil transversely across the width of the tape.

Embodiment 57

The method of embodiment 56, wherein moving the rotating cutting blade comprises rotating the rotating cutting blade at a rotation rate that is faster than a linear translation of the rotating cutting blade.

Embodiment 58

The method of embodiment 56, wherein cutting the tape comprises rotating the rotating cutting blade at a rotation rate that is independent of a linear translation of the rotating cutting blade.

Embodiment 59

The method of embodiment 56, wherein a tangential speed of the rotating cutting blade is greater than lineal motion of the rotating cutting blade.

Embodiment 60

The method of any of embodiments 32 through 59, further comprising translationally moving the gripper along first and second axes (x,y) orthogonal to each other and to an axis (z) normal to the surface of the substrate to position the second surface of the strip.

Embodiment 61

The method of any of embodiments 32 through 60, wherein:
advancing and cutting the elongated tape comprises advancing and cutting to produce multiple strips; and
positioning includes positioning the multiple strips respectively at multiple locations of the substrate.

Embodiment 62

A method comprising:
advancing an elongated tape having length l1 and width w1 with l1>w1 relative to a surface of a substrate;
cutting the elongated tape transversely along the width w1 of the tape using a cutting tool to produce a strip having length l2 and width w2 with l2>w2, and l2>w1, the strip having a first surface and an opposing second surface, a portion of the cutting tool pushing the first surface of the strip against a gripper while cutting the tape;
holding the first surface of the strip against the gripper while positioning the second surface of the strip on the surface of the substrate; and
releasing the first surface of the strip from the gripper.

Embodiment 63

The method of embodiment 62, wherein holding the strip comprises vacuum gripping the strip.

Embodiment 64

The method of embodiment 63, wherein releasing the strip comprises reducing the vacuum that holds the first surface of the strip to the gripper.

Embodiment 65

The method of embodiment 63, wherein releasing the strip comprises applying positive gas pressure to the strip through the gripper.

Embodiment 66

The method of embodiment 62, wherein holding the strip comprises mechanically gripping the strip.

Embodiment 67

The method of any of the embodiments 62 through 66, wherein positioning the strip comprises rotating the strip around its length axis before placing the second surface of the strip on the surface of the solar cell assembly.

Embodiment 68

The method of embodiment 67, wherein rotating the strip comprises rotating the strip about 90 degrees around its length axis.

Embodiment 69

The method of claim 62, wherein positioning the strip comprises translationally moving the strip along an axis normal to the surface of the substrate.

Embodiment 70

The method of any of the embodiments 62 through 69, wherein w1/w2 is in a range of 1 to 150.

Embodiment 71

The method of any of the embodiments 62 through 69, wherein w1/w2 is in a range of 50 to 100.

Embodiment 72

The method of any of the embodiments 62 through 71, wherein the tape comprises a metal film.

Embodiment 73

The method of embodiment 72, wherein the tape further comprises an adhesive layer.

Embodiment 74

The method of embodiment 73, wherein the tape further comprises a protective liner for the adhesive layer.

Embodiment 75

The method of any of the embodiments 62 through 71, wherein the tape comprises a light redirecting film.

Embodiment 76

The method of embodiment 75, wherein the light redirecting film comprises light redirecting prisms.

Embodiment 77

The method of embodiment 76, wherein the tape further comprises an adhesive layer.

Embodiment 78

The method of embodiment 77, wherein the tape further comprises a protective film for the adhesive layer.

Embodiment 79

The method of any of the embodiments 62 through 71, wherein:
the tape comprises a light redirecting film having linear prisms aligned along a prism longitudinal axis; and positioning the strip comprises positioning the strip independently of the prism longitudinal axis.

Embodiment 80

The method of any of the embodiments 62 through 79, wherein a thickness of the tape is in a range of about 20 to 500 μm or in a range of about 20 to 120 μm.

Embodiment 81

The method of any of the embodiments 62 through 80, wherein w2 is less than about 3 mm.

Embodiment 82

The method of any of the embodiments 62 through 81, further comprising removing a liner from the tape.

Embodiment 83

The method of embodiment 82, wherein removing the liner comprises removing the liner while advancing the tape relative to the surface of the substrate.

Embodiment 84

The method of embodiment 82, wherein removing the liner comprises removing the liner before cutting the tape.

Embodiment 85

The method of any of the embodiments 62 through 84, wherein cutting the tape comprises moving a rotating cutting blade and an anvil transversely across the width of the tape.

Embodiment 86

The method of embodiment 85, wherein moving the rotating cutting blade comprises rotating the rotating cutting blade at a rotation rate that is faster than a linear translation of the rotating cutting blade.

Embodiment 87

The method of embodiment 85, wherein cutting the tape comprises rotating the rotating cutting blade at a rotation rate that is independent of a linear translation of the rotating cutting blade.

Embodiment 88

The method of embodiment 85, wherein a tangential speed of the rotating cutting blade is greater than lineal motion of the rotating cutting blade.

Embodiment 89

The method of any of the embodiments 62 through 88, further comprising translationally moving the gripper along first and second axes (x,y) orthogonal to each other and to an axis (z) normal to the surface of the substrate to position the strip.

Embodiment 90

The method of any of the embodiments 62 through 89, wherein:

advancing and cutting the elongated tape comprises advancing and cutting multiple strips; and positioning includes positioning the multiple strips respectively at multiple locations of the substrate.

Embodiment 91

The method of any of the embodiments 62 through 90, wherein:

the strip comprises an adhesive layer; and further comprising heating the substrate to thermally activate the adhesive layer.

Embodiment 92

The method of any of the embodiments 62 through 91, wherein:

advancing the tape, cutting the tape transversely, holding the strip against the gripper while positioning the strip on the surface of a substrate, and releasing the strip from the gripper comprises a cycle; and further comprising implementing multiple cycles at a rate of about 1 cycle per second.

Embodiment 93

A method comprising:

advancing an elongated tape having length l1 and width w1 with l1>w1 relative to a surface of a solar substrate;

cutting the elongated tape transversely along the width w1 of the tape using a cutting tool to produce a strip having length l2 and width w2 with l2>w2, and l2>w1, the strip having a first surface and an opposing second surface, the cutting tool pushing the first surface of the strip against a gripper while cutting the tape;

holding the first surface of the strip against the gripper while positioning the second surface of the strip on the surface of the solar substrate; and releasing the first surface of the strip from the gripper.

Embodiment 94

The method of embodiment 93, wherein the solar substrate comprises one or more of a photovoltaic cell, an encapsulant, a backsheet, and a glass cover.

Embodiment 95

The method of any of the embodiments 93 through 94, wherein holding the strip comprises vacuum gripping the strip.

Embodiment 96

The method of embodiment 95, wherein releasing the strip comprises reducing the vacuum that holds the first surface of the strip to the gripper.

Embodiment 97

The method of any of the embodiments 93 through 96, wherein releasing the strip comprises applying positive gas pressure to the strip through the gripper.

Embodiment 98

The method of any of the embodiments 93 through 97, wherein holding the strip comprises mechanically gripping the strip.

Embodiment 99

The method of any of the embodiments 93 through 98, wherein positioning the strip comprises rotating the strip around its length axis before placing the second surface of the strip on the surface of the solar cell assembly.

Embodiment 100

The method of embodiment 99, wherein rotating the strip comprises rotating the strip about 90 degrees around its length axis.

Embodiment 101

The method of any of the embodiments 93 through 100, wherein positioning the strip comprises translationally moving the strip along an axis normal to the surface of the substrate.

Embodiment 102

The method of any of the embodiments 93 through 101, wherein w1/w2 is in a range of 1 to 150.

Embodiment 103

The method of any of the embodiments 93 through 101, wherein w1/w2 is in a range of 50 to 100.

Embodiment 104

The method of any of the embodiments 93 through 103, wherein the strip is positioned on a front side of the solar substrate and an aspect ratio of the strip, l2/w2, is at least about 20 or at least about 50.

Embodiment 105

The method of any of the embodiments 93 through 104, wherein the strip is positioned on a front side of the solar substrate and an aspect ratio of the strip, l2/w2, is at least about 75 or at least about 100.

Embodiment 106

The method of any of the embodiments 93 through 105, wherein the strip is positioned on a back side of the solar substrate and an aspect ratio of the strip, l2/w2, is about 1 or about 5.

Embodiment 107

The method of any of the embodiments 93 through 106, wherein the tape comprises a metal film.

Embodiment 108

The method of any of the embodiments 93 through 107, wherein the tape comprises an adhesive layer.

Embodiment 109

The method of embodiment 108, wherein the tape further comprises a protective liner for the adhesive layer.

Embodiment 110

The method of any of the embodiments 93 through 109, wherein the tape comprises a light redirecting film.

Embodiment 111

The method of embodiment 110, wherein the light redirecting film comprises light redirecting prisms.

Embodiment 112

The method of embodiment 111, wherein:
the light redirecting film comprises linear prisms aligned along a prism longitudinal axis; and
positioning the strip comprises positioning the strip independently of the prism longitudinal axis.

Embodiment 113

The method of any of the embodiments 93 through 112, wherein a thickness of the tape is in a range of about 20 to 500 µm or in a range of about 20 to 120 µm.

Embodiment 114

The method of any of the embodiments 93 through 113, wherein w2 is less than about 3 mm.

Embodiment 115

The method of any of the embodiments 93 through 114, further comprising removing a liner from the elongated tape.

Embodiment 116

The method of embodiment 115, wherein removing the liner comprises removing the liner while advancing the tape relative to the surface of the substrate.

Embodiment 117

The method of embodiment 115, wherein removing the liner comprises removing the liner before cutting the tape.

Embodiment 118

The method of any of the embodiments 93 through 117, wherein cutting the tape comprises moving a rotating cutting blade and an anvil transversely across the width of the tape.

Embodiment 119

The method of embodiment 118, wherein moving the rotating cutting blade comprises rotating the rotating cutting blade at a rotation rate that is faster than a linear translation of the rotating cutting blade.

Embodiment 120

The method of embodiment 118, wherein cutting the tape comprises rotating the rotating cutting blade at a rotation rate that is independent of a linear translation of the rotating cutting blade.

Embodiment 121

The method of embodiment 118, wherein a tangential speed of the rotating cutting blade is greater than lineal motion of the rotating cutting blade.

Embodiment 122

The method of any of the embodiments 93 through 121, further comprising translationally moving the gripper along first and second axes (x,y) orthogonal to each other and to an axis (z) normal to the surface of the substrate to position the second surface of the strip.

Embodiment 123

The method of any of the embodiments 93 through 122, wherein:
advancing and cutting the elongated tape comprises advancing and cutting to produce multiple strips; and
positioning includes positioning the multiple strips respectively at multiple locations of the substrate.

Embodiment 124

A system comprising:
a dispenser configured to advance an elongated tape having length l1 and width w1 with l1>w1;
a cutting tool configured to cut the elongated tape transversely along the width w1 of the tape to produce a strip having length l2 and width w2 where l2=w1, the strip having a first surface and an opposing second surface, a portion of the cutting tool configured to push the first surface of the strip against a gripper while cutting the tape; and
the gripper is configured to hold the first surface of the strip against the gripper while moving to position the second surface of the strip over the surface of a substrate, the gripper further configured to release the strip after positioning the strip.

Embodiment 125

The system of embodiment 124, wherein the gripper comprises;
a gripper arm that supports a gripper surface;
a vacuum pump coupled to apply vacuum through the gripper arm and gripper surface to a first surface of the strip, wherein the vacuum is sufficient to hold the strip against the gripper surface while the cutting tool cuts the tape and the gripper positions the strip;
a rotational actuator configured to rotate the gripper arm around its longitudinal axis; and
a translational actuator configured to mover the gripper arm translationally along an axis perpendicular to the surface of the substrate.

Embodiment 126

The system of any of the embodiments 124 through 125, further comprising:
a vacuum pump; and
a gripper surface supported by the gripper arm, the gripper surface configured to grip the first surface of the strip and having multiple vacuum holes fluidically coupled to the vacuum pump and positioned in a narrow area of the gripper surface corresponding to an area of the first surface of the strip.

Embodiment 127

The system of any of the embodiments 124 through 125, further comprising:
a vacuum pump; and
a gripper surface supported by the gripper arm, the gripper surface configured to grip the first surface of the strip and having multiple vacuum holes fluidically coupled to the vacuum pump and positioned to apply a vacuum to first surface of the strip.

Embodiment 128

The system of embodiment 127, wherein a spacing of the vacuum holes across the gripper surface is in a range of about 2 to 5 times a diameter of the vacuum holes.

Embodiment 129

The system of embodiment 127, wherein a diameter of the vacuum holes is in a range of about 0.008 to about 0.020 inches.

Embodiment 130

The system of embodiment 127, wherein a ratio of a diameter of the vacuum holes to the width of the strip is in a range about 10% to about 50%.

Embodiment 131

The system of any of the embodiments 124 through 130, wherein the gripper comprises a compliant gripper surface that faces the first surface of the strip.

Embodiment 132

The system of embodiment 131, wherein the compliant gripper surface comprises a polymer.

Embodiment 133

The system of embodiment 131, wherein the compliant gripper surface comprises a polymer and an adhesive.

Embodiment 134

The system of embodiment 131, wherein compliance of the compliant gripper surface is between 10 and 80 shore A.

Embodiment 135

The system of embodiment 131, wherein compliance of the compliant gripper surface is between 20 to 60 shore A.

Embodiment 136

The system of embodiment 131, wherein compliance of the compliant gripper surface is between 20 to 30 shore A.

Embodiment 137

The system of any of the embodiments 124 through 136, wherein the cutting tool comprises a rotary shear cutter.

Embodiment 138

The system of any of the embodiments 124 through 136, wherein the cutting tool comprises a rotary crush cutter.

Embodiment 139

The system of any of the embodiments 124 through 136, wherein the cutting tool comprises a rotary blade, an anvil, and a motor coupled to the anvil.

Embodiment 140

The system of any of the embodiments 124 through 139, wherein the dispenser comprises:
an input spindle upon which a roll of the tape can be mounted;
a peel bar configured to remove a liner from the tape; and
a take up spindle configured to hold a waste liner roll that holds the liner after the liner is removed from the tape.

Embodiment 141

The system of any of the embodiments 124 through 140, further comprising one or both of:
an input spindle motor coupled to cause rotation of the input spindle to advance the tape; and
a take up spindle motor coupled to cause rotation of the take up spindle.

Embodiment 142

The system of embodiment 141, further comprising a brake configured to control liner tension.

Embodiment 143

The system of embodiment 142, wherein the brake comprises an electromagnetic particle brake, a mechanical friction brake, a hydraulic friction brake, or a pneumatic brake that controls the liner tension to about 2 to 100 grams per mm of width w2 of the strip.

Embodiment 144

The system of claim 141, wherein the take up spindle motor is coupled to cause rotation of both the input spindle and the take up spindle.

Embodiment 145

The system of any of the embodiments 124 through 144, wherein a radius of curvature of the peel edge of the peel bar is about 5%-20% of the width w2 of the strip.

Embodiment 146

The system of any of the embodiments 124 through 145, further comprising a movement system configured to provide translational movement of at least a gripper arm and gripper surface along first, x, and second, y, axes that are orthogonal to each other and orthogonal to an axis normal to the surface of the substrate.

Embodiment 147

The system of embodiment 146, wherein the movement system is configured to align the strip or align multiple strips with the substrate along the x and y axes.

Embodiment 148

The system of embodiment 146, wherein the movement system is further configured to provide at least one of translational movement and rotational movement of one or both of the dispenser and the cutting tool.

Embodiment 149

The system of any of the embodiments 124 through 148, further comprising a control system configured to control operation of one or more of the dispenser, cutting tool, and gripper.

Embodiment 150

The system of embodiment 149, wherein the control system is programmable to control the dispenser and the cutting tool to cut strips of variable widths.

Embodiment 151

The system of embodiment 149, wherein the control system is capable of controlling translational and/or rotational movement of the dispenser, cutting tool, and/or gripper.

Embodiment 152

The system of embodiment 149, wherein the advancing the tape, cutting the tape transversely, holding the strip against the gripper while positioning the strip on the surface of a substrate, and releasing the strip from the gripper comprises a cycle; and the control system is configured to implement multiple cycles at a rate of about 1 cycle per second.

Embodiment 153

The system of any of the embodiments 124 through 152, further comprising a sensor configured to detect a position of the tape.

Embodiment 154

The system of embodiment 153, wherein the sensor is a proximity sensor.

Embodiment 155

The system of embodiment 153, wherein the sensor is an optical sensor.

Embodiment 156

The system of embodiment 153, wherein the sensor is a vision sensor.

Embodiment 157

The system of any of the embodiments 124 through 156, further comprising an alignment system configured to align the strip relative to the substrate.

Embodiment 158

The system of embodiment 157, wherein the alignment system comprises a vision sensor.

Embodiment 159

The system of embodiment 157, wherein the alignment system comprises an optical sensor.

Embodiment 160

The system of embodiment 157, wherein the alignment system comprises a sensor configured to detect fiducials on the tape or the strip.

Embodiment 161

The system of any of the embodiments 124 through 160, further comprising a sensor configured to detect a position of the strip while the strip is gripped by the gripper.

Embodiment 162

The system of embodiment 161, wherein the sensor is a proximity sensor.

Embodiment 163

The system of embodiment 161, wherein the sensor is an optical sensor.

Embodiment 164

The system of embodiment 161, wherein the sensor is a vision sensor.

Embodiment 165

A system comprising:
- a dispenser configured to advance an elongated tape having length l1 and width w1 with l1>w1 relative to a surface of a substrate;
- a cutting tool configured to cut the elongated tape transversely along the width w1 of the tape to produce a strip having length l2 and width w2 where l2>w2 and l2>w1, the strip having a first surface and an opposing second surface, a portion of the cutting tool configured to push the first surface of the strip against a gripper while cutting the tape; and
- the gripper is configured to hold the first surface of the strip against the gripper while moving to position the second surface of the strip over the surface of a substrate, the gripper further configured to release the strip after positioning the strip.

Embodiment 166

The system of embodiment 165, wherein the gripper comprises;
- a gripper arm that supports a gripper surface;
- a vacuum pump coupled to apply vacuum through the gripper arm and gripper surface to a first surface of the strip, wherein the vacuum is sufficient to hold the strip against the gripper surface while the cutting tool cuts the tape and the gripper positions the strip;
- a rotational actuator configured to rotate the gripper arm around its longitudinal axis; and
- a translational actuator configured to mover the gripper arm translationally along an axis perpendicular to the surface of the substrate.

Embodiment 167

The system of any of the embodiments 165 through 166, further comprising:
- a vacuum pump; and
- a gripper surface supported by the gripper arm, the gripper surface configured to grip the first surface of the strip and having multiple vacuum holes fluidically coupled to the vacuum pump and positioned in a narrow area of the gripper surface corresponding to an area of the first surface of the strip.

Embodiment 168

The system of any of the embodiments 165 through 167, further comprising:
- a vacuum pump; and
- a gripper surface supported by the gripper arm, the gripper surface configured to grip the first surface of the strip and having multiple vacuum holes fluidically coupled to the vacuum pump and positioned to apply a vacuum to first surface of the strip.

Embodiment 169

The system of embodiment 168, wherein a spacing of the vacuum holes across the gripper surface is in a range of about 2 to 5 times a diameter of the vacuum holes.

Embodiment 170

The system of embodiment 168, wherein a diameter of the vacuum holes is in a range of about 0.008 to about 0.020 inches.

Embodiment 171

The system of embodiment 168, wherein a ratio of a diameter of the vacuum holes to the width of the strip is in a range about 10% to about 50%.

Embodiment 172

The system of any of the embodiments 165 through 171, wherein the gripper comprises a compliant gripper surface that faces the first surface of the strip.

Embodiment 173

The system of embodiment 171, wherein the compliant gripper surface comprises at least one of a polymer and an adhesive.

Embodiment 174

The system of embodiment 171, wherein compliance of the compliant gripper surface is between 10 and 80 shore A.

Embodiment 175

The system of embodiment 171, wherein compliance of the compliant gripper surface is between 20 to 60 shore A.

Embodiment 176

The system of claim 171, wherein compliance of the compliant gripper surface is between 20 to 30 shore A.

Embodiment 177

The system of any of the embodiments 165 through 176, wherein the cutting tool comprises a rotary shear cutter.

Embodiment 178

The system of any of the embodiments 165 through 176, wherein the cutting tool comprises a rotary crush cutter.

Embodiment 179

The system of any of the embodiments 165 through 176, wherein the cutting tool comprises a rotary blade, an anvil, and a motor coupled to the anvil.

Embodiment 180

The system of any of the embodiments 165 through 179, wherein the dispenser comprises:
an input spindle upon which a roll of the tape can be mounted;
a peel bar configured to remove a liner from the tape; and
a take up spindle configured to hold a waste liner roll that holds the liner after the liner is removed from the tape.

Embodiment 181

The system of embodiment 180, further comprising one or both of:
an input spindle motor coupled to cause rotation of the input spindle to advance the tape; and
a take up spindle motor coupled to cause rotation of the take up spindle.

Embodiment 182

The system of embodiment 181, further comprising a brake configured to control tension of the liner.

Embodiment 183

The system of claim 182, wherein the brake comprises an electromagnetic particle brake that controls the liner tension to about 2 to 100 grams per mm of width w2 of the strip

Embodiment 184

The system of embodiment 181, wherein the take up spindle motor is coupled to cause rotation of both the input spindle and the take up spindle.

Embodiment 185

The system of any of the embodiments 165 through 184, wherein a radius of curvature of the peel edge of the peel bar is about 5%-20% of the width w2 of the strip.

Embodiment 186

The system of any of the embodiments 165 through 185, further comprising a movement system configured to provide translational movement of at least a gripper arm and gripper surface along first, x, and second, y, axes that are orthogonal to each other and orthogonal to an axis normal to the surface of the substrate.

Embodiment 187

The system of embodiment 186, wherein the movement system is configured to align the strip or align multiple strips with the substrate along the x and y axes.

Embodiment 188

The system of embodiment 186, wherein the movement system is further configured to provide at least one of translational movement and rotational movement of one or both of the dispenser and the cutting tool.

Embodiment 189

The system of any of the embodiments 165 through 188, further comprising a control system configured to control operation of one or more of the dispenser, cutting tool, and gripper.

Embodiment 190

The system of embodiment 189, wherein the control system is programmable to control the dispenser and the cutting tool to cut strips of variable widths.

Embodiment 191

The system of embodiment 189, wherein the control system is capable of controlling translational and/or rotational movement of the dispenser, cutting tool, and/or gripper.

Embodiment 192

The system of embodiment 189, wherein the advancing the tape, cutting the tape transversely, holding the strip against the gripper while positioning the strip on the surface of a substrate, and releasing the strip from the gripper comprises a cycle; and the control system is configured to implement multiple cycles at a rate of about 1 cycle per second.

Embodiment 193

The system of any of the embodiments 165 through 193, further comprising a sensor configured to detect a position of the tape.

Embodiment 194

The system of embodiment 193, wherein the sensor is an optical sensor.

Embodiment 195

The system of embodiment 193, wherein the sensor is a vision sensor.

Embodiment 196

The system of any of the embodiments 165 through 195, further comprising an alignment system configured to align the strip relative to the substrate.

Embodiment 197

The system of embodiment 196, wherein the alignment system comprises a vision sensor.

Embodiment 198

The system of embodiment 196, wherein the alignment system comprises an optical sensor.

Embodiment 199

The system of embodiment 196, wherein the alignment system comprises a sensor configured to detect fiducials on the tape or the strip.

Embodiment 200

The system of any of the embodiments 165 through 199, further comprising a proximity sensor configured to detect a position of the strip while the strip is gripped by the gripper.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of these embodiments will be apparent to those skilled in the art and it should be understood that this scope of this disclosure is not limited to the illustrative embodiments set forth herein. For example, the reader should assume that features of one disclosed embodiment can also be applied to all other disclosed embodiments unless otherwise indicated.

The invention claimed is:

1. A method comprising:
   advancing an elongated tape having length l1 and width w1 with l1>w1 relative to a surface of a substrate;
   cutting the elongated tape transversely along the width w1 of the tape using a cutting tool, the cutting producing a strip having a first surface and an opposing second surface and having length l2 and width w2, wherein l2=w1, a portion of the cutting tool pushing the first surface of the strip against a gripper while cutting the tape;
   providing translational movement of at least a gripper arm and a gripper surface of the gripper along first, x, and second, y, axes that are orthogonal to each other and orthogonal to an axis normal to the surface of the substrate;
   holding the first surface of the strip against the gripper while positioning the second surface of the strip on the surface of the substrate; and
   releasing the strip from the gripper.

2. The method of claim 1, wherein holding the strip comprises vacuum gripping the strip.

3. The method of claim 2, wherein releasing the strip comprises reducing the vacuum that holds the first surface of the strip to the gripper.

4. The method of claim 1, wherein positioning the strip comprises rotating the strip around its length axis before placing the second surface of the strip on a surface of a solar cell assembly.

5. The method of claim 1, wherein positioning the strip comprises translationally moving the strip along an axis normal to the surface of the substrate.

6. The method of claim 1, wherein the tape comprises a metal film.

7. The method of claim 6, wherein the tape further comprises an adhesive layer.

8. The method of claim 7, wherein the tape further comprises a protective liner for the adhesive layer.

9. A system comprising:
   a dispenser configured to advance an elongated tape having length l1 and width w1 with l1>w1;
   a cutting tool configured to cut the elongated tape transversely along the width w1 of the tape to produce a strip having length l2 and width w2 where l2=w1, the strip having a first surface and an opposing second surface, a portion of the cutting tool configured to push the first surface of the strip against a gripper while cutting the tape; and
   a movement system configured to provide translational movement of at least a gripper arm and a gripper surface along first, x, and second, y, axes that are orthogonal to each other and orthogonal to an axis normal to a surface of a substrate;
   wherein the gripper is configured to hold the first surface of the strip against the gripper while moving to position the second surface of the strip over the surface of the substrate, the gripper further configured to release the strip after positioning the strip.

10. The system of claim 9, further comprising:
    a vacuum pump; and
    the gripper surface supported by the gripper arm, the gripper surface configured to grip the first surface of the strip and having multiple vacuum holes fluidically coupled to the vacuum pump and positioned to apply a vacuum to the first surface of the strip.

11. The system of claim 9, wherein the gripper comprises a compliant gripper surface that faces the first surface of the strip.

12. The system of claim 9, wherein the dispenser comprises:
    an input spindle upon which a roll of the tape can be mounted;
    a peel bar configured to remove a liner from the tape; and
    a take up spindle configured to hold a waste liner roll that holds the liner after the liner is removed from the tape.

13. The system of claim 9, further comprising one or both of:

an input spindle motor coupled to cause rotation of an input spindle to advance the tape; and a take up spindle motor coupled to cause rotation of a take up spindle.

14. The system of claim 9, wherein the movement system is configured to align the strip or align multiple strips with the substrate along the x and y axes.

* * * * *